United States Patent
Lawrence et al.

(10) Patent No.: US 11,283,248 B2
(45) Date of Patent: Mar. 22, 2022

(54) SPINE FOR PROTECTING AND SUPPORTING A CABLE HARNESS

(71) Applicant: MOLEX, LLC, Lisle, IL (US)

(72) Inventors: Tommy Lawrence, Little Rock, AR (US); Robert Dillman, Santa Clara, CA (US); Dan Cantrell, Conway, AR (US); Michael Davis, Mayflower, AR (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/979,861

(22) PCT Filed: Mar. 28, 2019

(86) PCT No.: PCT/US2019/024542
§ 371 (c)(1),
(2) Date: Sep. 11, 2020

(87) PCT Pub. No.: WO2019/191401
PCT Pub. Date: Oct. 3, 2019

(65) Prior Publication Data
US 2021/0044094 A1      Feb. 11, 2021

Related U.S. Application Data

(60) Provisional application No. 62/649,948, filed on Mar. 29, 2018.

(51) Int. Cl.
*H02G 3/04* (2006.01)
*H05K 7/14* (2006.01)

(52) U.S. Cl.
CPC ......... *H02G 3/0418* (2013.01); *H02G 3/0481* (2013.01); *H05K 7/1491* (2013.01)

(58) Field of Classification Search
CPC ...... H02G 3/0418; H02G 3/04; H02G 3/0437; H01B 13/145; H01B 13/24; H01B 1/04;
(Continued)

(56) References Cited

U.S. PATENT DOCUMENTS

| | | |
|---|---|---|
| 1,627,286 A | 5/1927 | Ile |
| D140,570 S | 3/1945 | Leopold |

(Continued)

FOREIGN PATENT DOCUMENTS

| | | |
|---|---|---|
| CN | 107453158 A | 12/2017 |
| JP | 2004278625 A | 10/2004 |

(Continued)

OTHER PUBLICATIONS

Notice of allowance received for U.S. Appl. No. 29/642,488, dated Feb. 21, 2019, 8 pages.

(Continued)

*Primary Examiner* — William H. Mayo, III
*Assistant Examiner* — Krystal Robinson

(57) ABSTRACT

A spine is configured to support and protect a cable harness. The spine includes a plurality of segments arranged along an axis. Each segment includes a first and second housing parts which can be closed to form a passageway or can be opened to expose cavities within each housing part. The housing parts are mated together at adjacent ends by couplings. The housing parts form at least one opening which accepts a cable of the cable harness. A lock is engaged to lock the housing parts in a closed position.

20 Claims, 22 Drawing Sheets

(58) Field of Classification Search
CPC .......... H01B 3/22; H01B 3/443; H01B 3/445; H01B 3/465; H01B 7/0009; H01B 7/02; H01B 7/0216; H01B 7/1875; H01B 7/292; G02B 6/4471; B60R 16/0215; F16L 9/22
USPC ........................................................ 174/101
See application file for complete search history.

(56) References Cited

U.S. PATENT DOCUMENTS

| | | | |
|---|---|---|---|
| D180,354 S | 5/1957 | Benson | |
| 3,163,926 A | 1/1965 | Gray | |
| D207,535 S | 5/1967 | Wahl | |
| 3,338,599 A * | 8/1967 | Hallman | H02G 3/0608 285/284.1 |
| 3,636,984 A * | 1/1972 | Rauhauser | H02G 3/0418 138/155 |
| 3,761,603 A * | 9/1973 | Hays | H02G 3/045 174/101 |
| 4,398,564 A * | 8/1983 | Young | H02G 3/0418 138/155 |
| 4,453,353 A | 6/1984 | Killop et al. | |
| 4,643,505 A | 2/1987 | House et al. | |
| D293,433 S | 12/1987 | Brooks et al. | |
| D296,779 S | 7/1988 | Watson | |
| 5,139,429 A | 8/1992 | Herman et al. | |
| D332,940 S | 2/1993 | Finlay | |
| 5,217,387 A | 6/1993 | Hull et al. | |
| 5,259,782 A | 11/1993 | Giffin | |
| 5,584,720 A | 12/1996 | Elswick | |
| 5,586,012 A * | 12/1996 | Lerman | H04Q 1/14 211/26 |
| 5,597,980 A * | 1/1997 | Weber | H02G 3/0418 123/143 C |
| 5,713,753 A | 2/1998 | Bayer et al. | |
| D407,377 S | 3/1999 | Landerholm et al. | |
| D408,365 S | 4/1999 | Sanders | |
| 5,957,556 A * | 9/1999 | Singer | G06F 13/409 312/223.6 |
| 6,012,683 A * | 1/2000 | Howell | F16L 3/26 174/101 |
| 6,216,746 B1 * | 4/2001 | Guebre-Tsadik | H02G 3/0418 138/155 |
| 6,220,893 B1 | 4/2001 | Stephan | |
| 6,380,484 B1 * | 4/2002 | Theis | F16L 3/26 174/101 |
| 6,448,497 B1 * | 9/2002 | McCracken | H02G 3/0437 138/117 |
| D464,325 S | 10/2002 | Peters et al. | |
| D473,524 S | 4/2003 | Koehler | |
| 6,870,095 B1 * | 3/2005 | Whitted | H04Q 1/066 174/135 |
| 6,875,918 B2 | 4/2005 | Sudo et al. | |
| 6,900,385 B1 * | 5/2005 | Hsu | H02G 3/0462 174/36 |
| D508,232 S | 8/2005 | Suckle et al. | |
| 7,049,508 B2 * | 5/2006 | Bushey | H02G 3/0425 174/481 |
| 7,140,578 B1 * | 11/2006 | Robinett | F16L 3/1226 248/49 |
| 7,189,100 B1 | 3/2007 | Colbourne | |
| D571,733 S | 6/2008 | Seil | |
| D586,757 S | 2/2009 | Minnick | |
| 7,553,181 B1 | 6/2009 | Van Dalinda, III | |
| 7,601,029 B2 | 10/2009 | Horiuchi et al. | |
| D607,412 S | 1/2010 | Palomaki | |
| D631,848 S | 2/2011 | Montena et al. | |
| D643,378 S | 8/2011 | Pippert et al. | |
| D646,227 S | 10/2011 | Natoli | |
| 8,129,631 B1 | 3/2012 | Shemtov | |
| D667,796 S | 9/2012 | Boossekey | |
| 8,702,440 B2 | 4/2014 | Nooner et al. | |
| 8,737,090 B2 * | 5/2014 | Jai | H05K 7/1491 361/826 |
| D762,583 S | 8/2016 | Dick | |
| 9,431,802 B2 * | 8/2016 | Anselmo | H02G 3/0437 |
| D776,623 S | 1/2017 | Jenkins | |
| D784,928 S | 4/2017 | Armacost et al. | |
| 9,653,837 B2 | 5/2017 | Nooner et al. | |
| D813,015 S | 3/2018 | O'Brien et al. | |
| D821,988 S | 7/2018 | Chang | |
| 10,056,718 B2 | 8/2018 | Dang et al. | |
| 10,056,745 B2 | 8/2018 | Nooner et al. | |
| D837,158 S | 1/2019 | Thoni et al. | |
| D840,920 S | 2/2019 | Fletcher et al. | |
| D840,922 S | 2/2019 | Fletcher et al. | |
| D840,923 S | 2/2019 | Fletcher et al. | |
| D843,315 S | 3/2019 | Fletcher et al. | |
| D843,952 S | 3/2019 | Smith | |
| D847,091 S | 4/2019 | Bureacov et al. | |
| D847,098 S | 4/2019 | Nooner et al. | |
| D848,376 S | 5/2019 | Hewitt | |
| 10,285,769 B2 | 5/2019 | Ray | |
| D865,692 S * | 11/2019 | Lawrence | D13/184 |
| 11,005,244 B2 * | 5/2021 | Yamamoto | H02G 3/0437 |
| 2004/0026558 A1 * | 2/2004 | Murphy | H02G 3/26 242/404.3 |
| 2004/0097120 A1 | 5/2004 | Limber et al. | |
| 2009/0261211 A1 * | 10/2009 | Anguiano-Wehde | H05K 7/1448 248/56 |
| 2010/0147584 A1 * | 6/2010 | Suzuki | H02G 3/0437 174/72 C |
| 2010/0230157 A1 * | 9/2010 | Sakata | B60R 16/0215 174/72 A |
| 2012/0293932 A1 | 11/2012 | Jai | |
| 2014/0218844 A1 * | 8/2014 | Tseng | H05K 7/1492 361/679.01 |
| 2016/0244003 A1 * | 8/2016 | Chaanine | H02G 3/0487 |
| 2016/0268723 A1 * | 9/2016 | Berengut | H01R 13/6392 |
| 2017/0117644 A1 | 4/2017 | Peltier et al. | |

FOREIGN PATENT DOCUMENTS

| | | |
|---|---|---|
| JP | 2006006034 A | 1/2006 |
| JP | 2007306777 A | 11/2007 |
| JP | 2009196498 A | 9/2009 |
| JP | 2016063709 A | 4/2016 |
| KR | 20-0380818 Y1 | 4/2005 |
| KR | 10-0848693 B1 | 7/2008 |
| WO | 2015/001931 A1 | 1/2015 |
| WO | 2015/016056 A1 | 2/2015 |

OTHER PUBLICATIONS

Notice of allowance received for U.S. Appl. No. 29/642,491, dated May 6, 2019, 10 pages.
Notice of allowance received for U.S. Appl. No. 29/642,494, dated Jun. 20, 2019, 7 pages.
International search report and written opinion received for PCT application No. PCT/US2019/024542, dated Aug. 19, 2019, 9 pages.
Ex parte Quayle action received for U.S. Appl. No. 29/642,491, dated Feb. 8, 2019, 6 pages.
Office Action received for CN Application No. 201980023499.9, dated Jun. 28, 2021, 10 Pages (05 Pages of English Translation and 05 Pages of Official notification).
Office Action received for JP Application No. 2020-546489, dated Nov. 9, 2021, 06 Pages (03 Pages of English Translation and 03 Pages of Official notification).

* cited by examiner

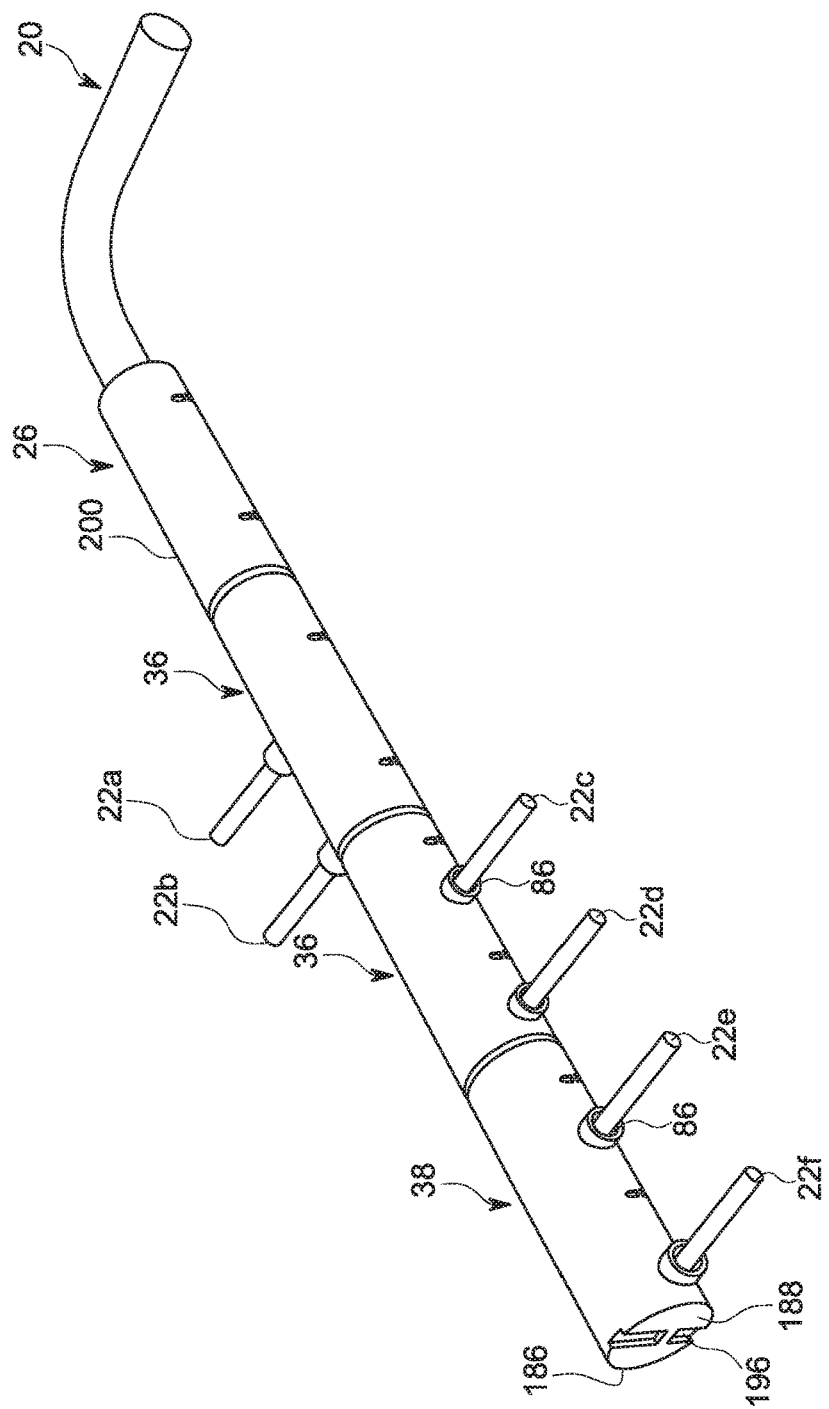
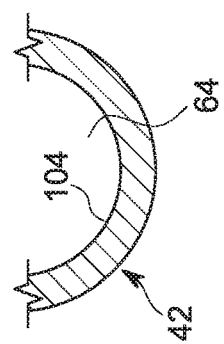
FIG. 21
FIG. 20

SPINE FOR PROTECTING AND SUPPORTING A CABLE HARNESS

RELATED APPLICATIONS

This application claims priority to International Application No. PCT/US2019/024542, filed Mar. 28, 2019, which further claims the domestic benefit of U.S. Provisional Application Ser. No. 62/649,948, filed on Mar. 29, 2018, the contents of which are incorporated herein in their entirety.

FIELD OF THE INVENTION

The present disclosure relates to field of cable harness protective and support spines, particularly, rigid spines used in computer racks in data centers to protect cable harnesses.

DESCRIPTION OF RELATED ART

In the field of computer technology, systems architects have traditionally relied upon soft-form electronic cable harnesses to provide external interconnections between modular network computing system components such as switches, routers, relays and the like; and printed circuit boards providing interconnections between surface-mount, press-fit, and other similar components and modules within computing and related machines.

These interconnects are typically known to sag placing stress and load on interconnections, stresses which can adversely affect signal integrity, insertion stability, mating balance, and other mechanical and electrical characteristics of performance. Further, traditional soft-form and semi-rigid form cable harnesses are only nominally protected from environmental and human factors hazards including electrical field, metrological, and accidental occurrence within the installation or environment.

Typically, input/output cables have been most widely used to provide switch to server connections outside of the rack. Now, data rate speed requirements are ever increasing and the density and speeds achievable with backplane connectors and cables are being used in these rack solutions. Therefore, while existing protective devices for cable harnesses have been generally adequate for their intended purpose, they have not been entirely adequate in every aspect. Certain individuals would appreciate a more robust protective devices for cable harnesses that can also increase the build and assembly of such connections on a system rack.

BRIEF SUMMARY

A cable network is provided for use within system rack architecture. Typically, the rack includes a switch that interconnects individual servers, routers or relays in a rack to an aggregation switch. The switch can be mounted at the "Top of the Rack" or "Middle of the Rack" and includes a passage or channel to route the cables necessary for the communication network. The racks are generally assembled and built on site. Due to the extent of cables and necessary routing, the time involved to build these racks can be long and tedious.

In an embodiment of the disclosure, a spine for protecting and supporting a cable harness is used to facilitate the assembly of such racks. The spine includes a plurality of individual segments arranged in an adjacent manner along the height of the rack. The segments are interconnected end-to-end and include openings forming exit ports along the length. The exit ports extend at an angle to a longitudinal direction of the segment and are used to route individual cable segments to a specific module, server or router. In some embodiments, the segments include couplings that allow for articulation in a rotational and longitudinal direction. A conductive layer may be incorporated into each segment, providing the ability to adjust the electrical characteristics of the spine for improvements in electromagnetic compatibility.

A prevailing method is to advance interconnects, both within and without, system components and networks, by means of ultra-high-speed cable and harness solutions. These ultra-high-speed interconnects are critical-to-design in the architecture of modern data centers and cloud computing infrastructure. The segmented spine of the present disclosure provides a layered protective structure for the rack and allows for increased efficient during the build by including specific paths and routing for each cable segment assignment. This also facilitates the possibility of routing path pre-assignment and pre-build of the cable harness and spine sections.

BRIEF DESCRIPTION OF THE DRAWINGS

The present disclosure is illustrated by way of example, and not limited, in the accompanying figures in which like reference numerals indicate similar elements and in which:

FIG. 20 depicts a cross-sectional view through a portion of a housing part of any of the embodiments;

FIG. 21 depicts a perspective view of a further embodiment of the spine and with a cable harness attached thereto;

DETAILED DESCRIPTION

As required, the appended figures illustrate embodiments of the present disclosure and it is to be understood that the disclosed embodiments are merely exemplary of the disclosure, which may be embodied in various forms. Therefore, specific details disclosed herein are not to be interpreted as limiting, but merely as a basis for the claims and as a representative basis for teaching one skilled in the art to variously employ the present disclosure In recent years, the development of ultra-high-speed cable and harness interconnects using very fine gauge coaxial, twin axial, stranded, solid core and other conductors, manufactured from copper and other metallic, alloy and fiber-optic materials. Additionally, the rapid advancement of metallic, plastic, and composite material and manufacturing technologies has led to broad applicability of new construction opportunities for structured geometries constructed from materials suitable for a myriad of applications requiring environmental and loads withstanding, as well as for overall application in the areas of beautification and organization. As the performance of these interfaces have been pushed beyond their mechanical and theoretical limits, new methods of systems architecture are necessary to advance these integrations state-of-the-art in terms of signal integrity, by continually reducing the dielectric coefficients surrounding interconnect solutions.

Figure 1:
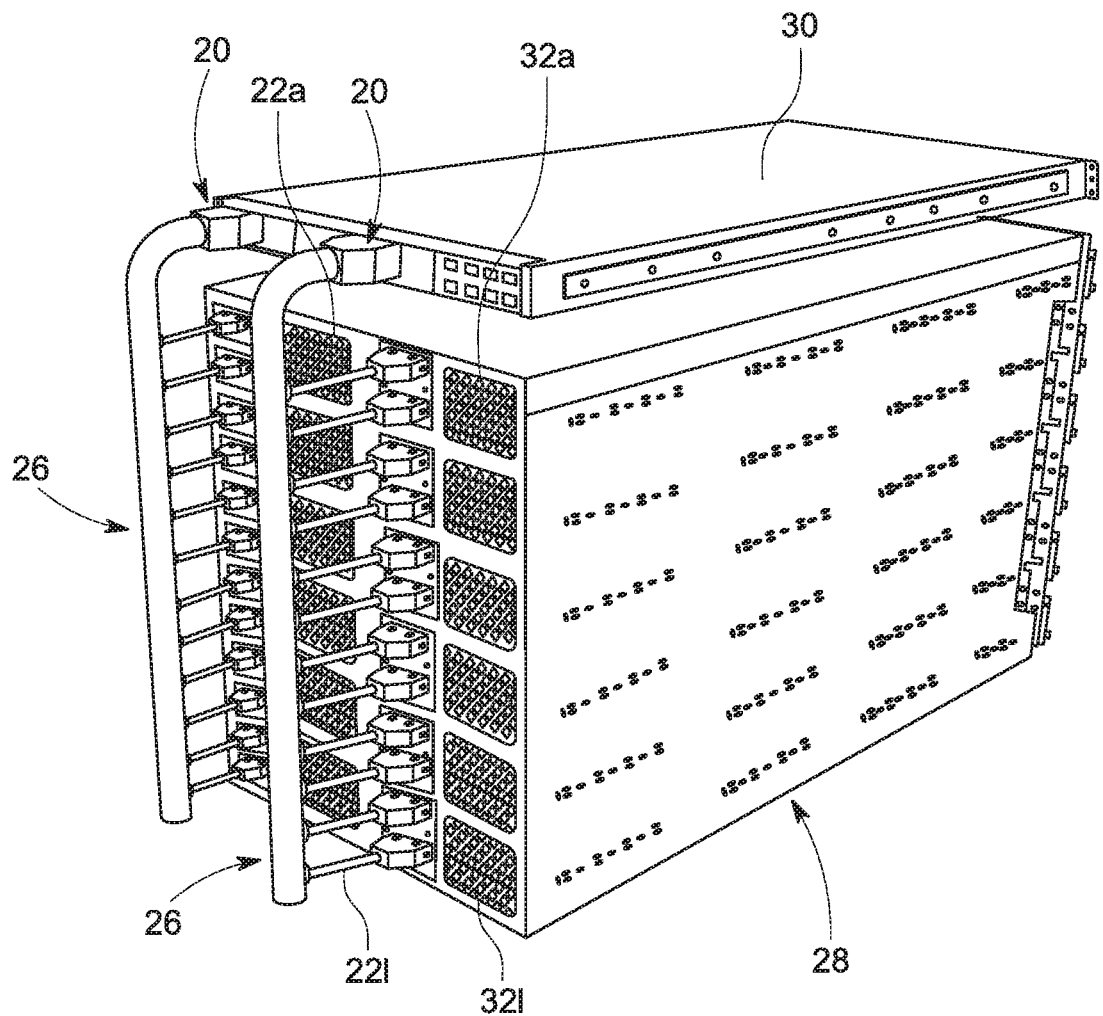
FIG. 1 depicts a perspective view of a computer rack having two spines which incorporate features of the present disclosure and coupled to the computer rack to route cables of a cable harness.
Figure 2:
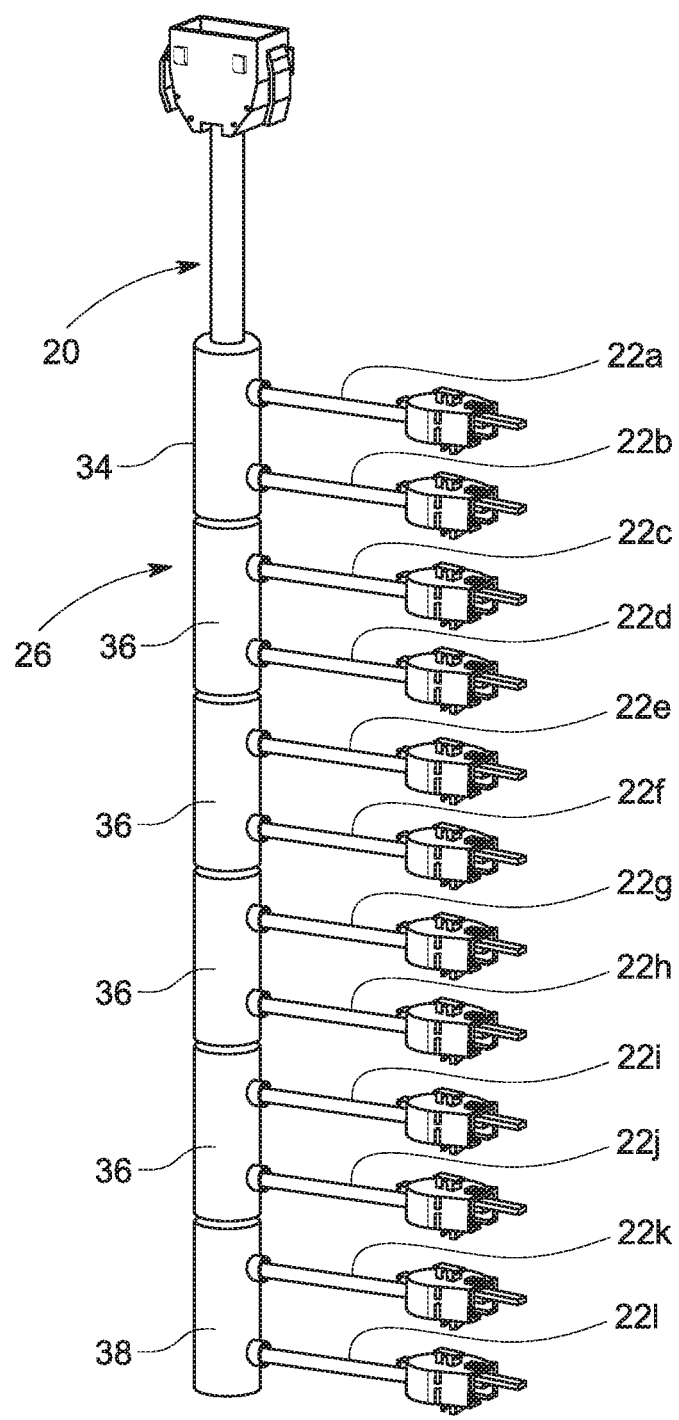
FIG. 2 depicts a perspective view of a spines which incorporate features of the present disclosure and a cable harness attached thereto.
Figure 3:
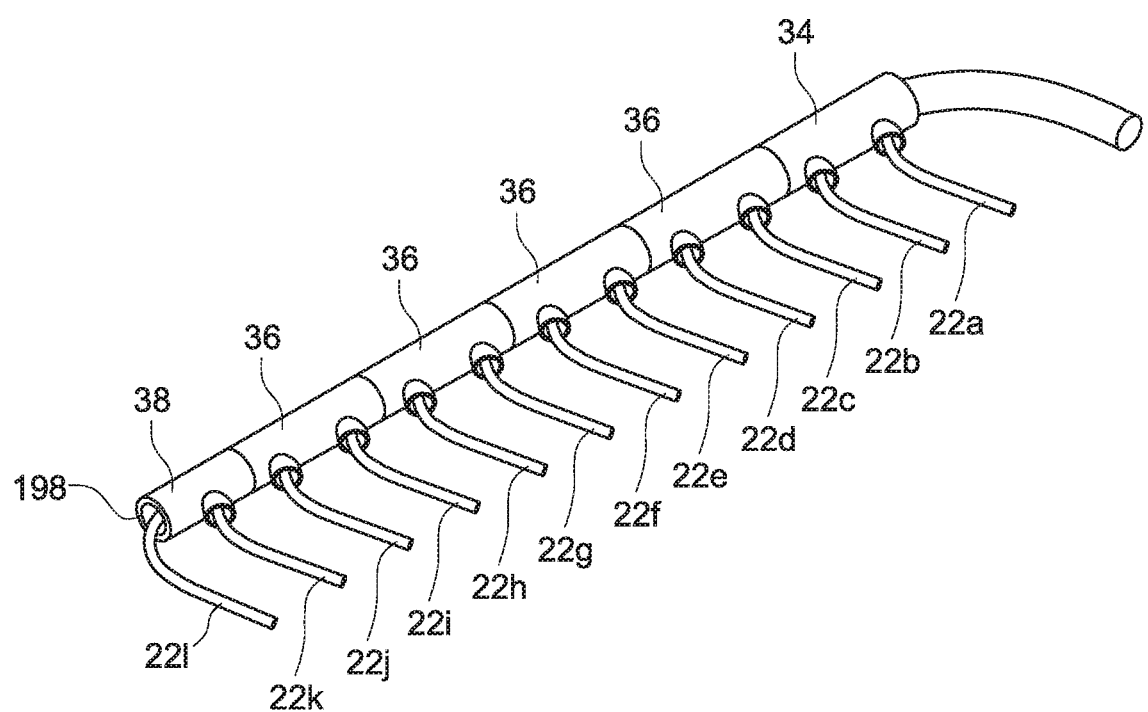
FIG. 3 depicts a perspective view of an embodiment of the spine and a cable harness attached thereto.
Figure 4:
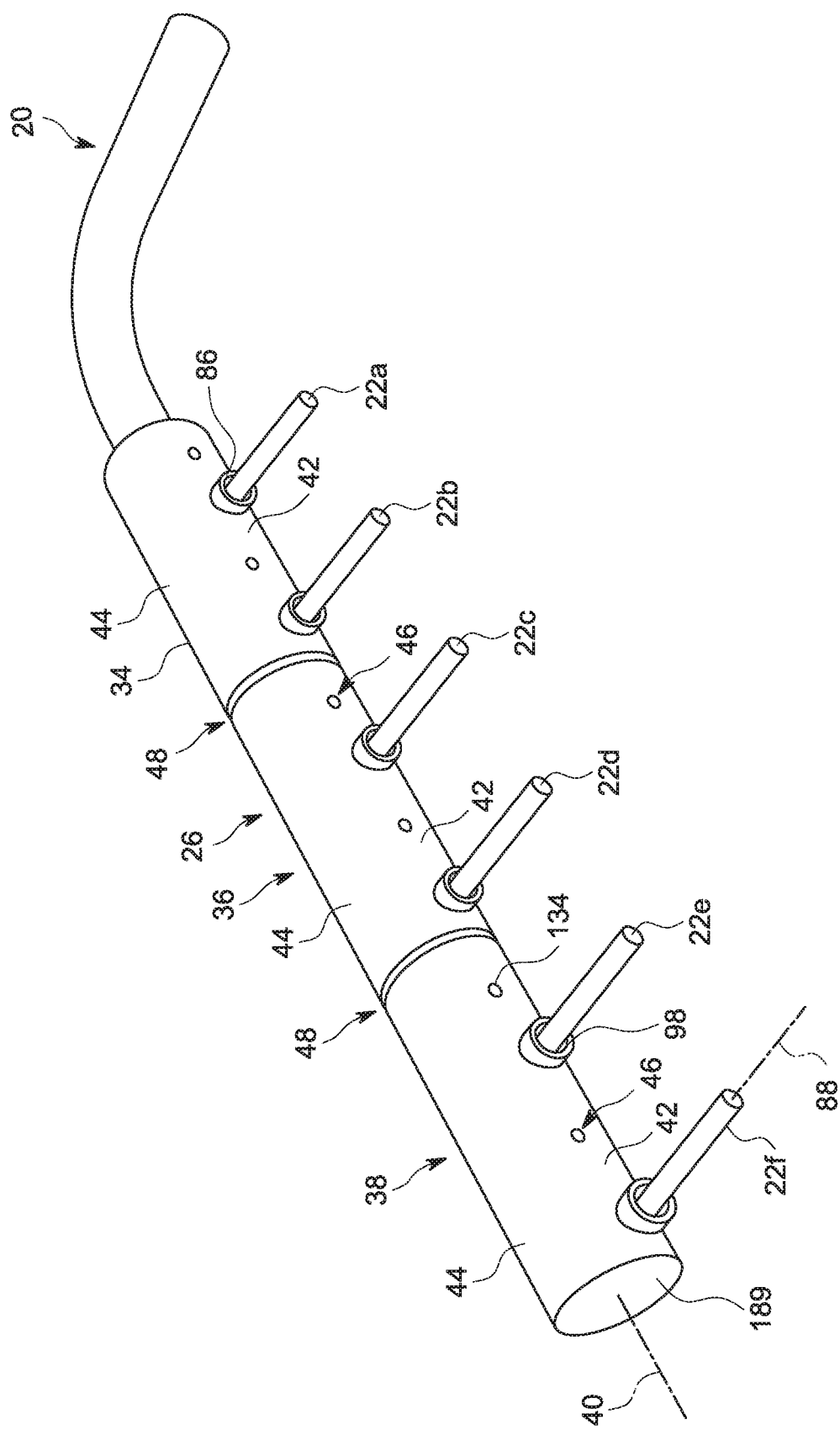
FIG. 4 depicts a perspective view of an embodiment of the spine and a cable harness attached thereto.
Figure 5:
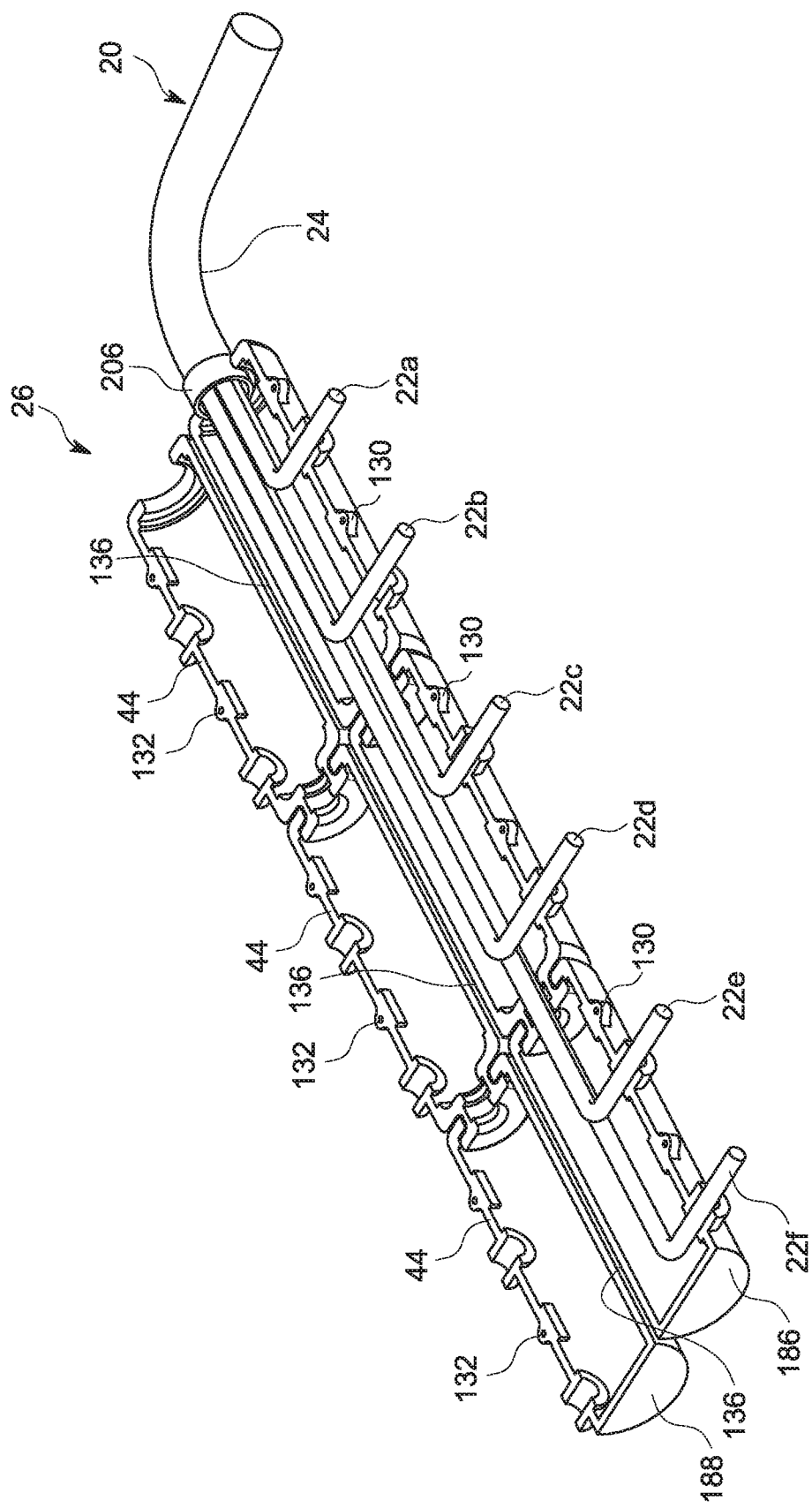
FIG. 5 depicts a perspective view of the embodiment of the spine shown in FIG. 4 in an open position and with the cable harness attached thereto.
Figure 6:
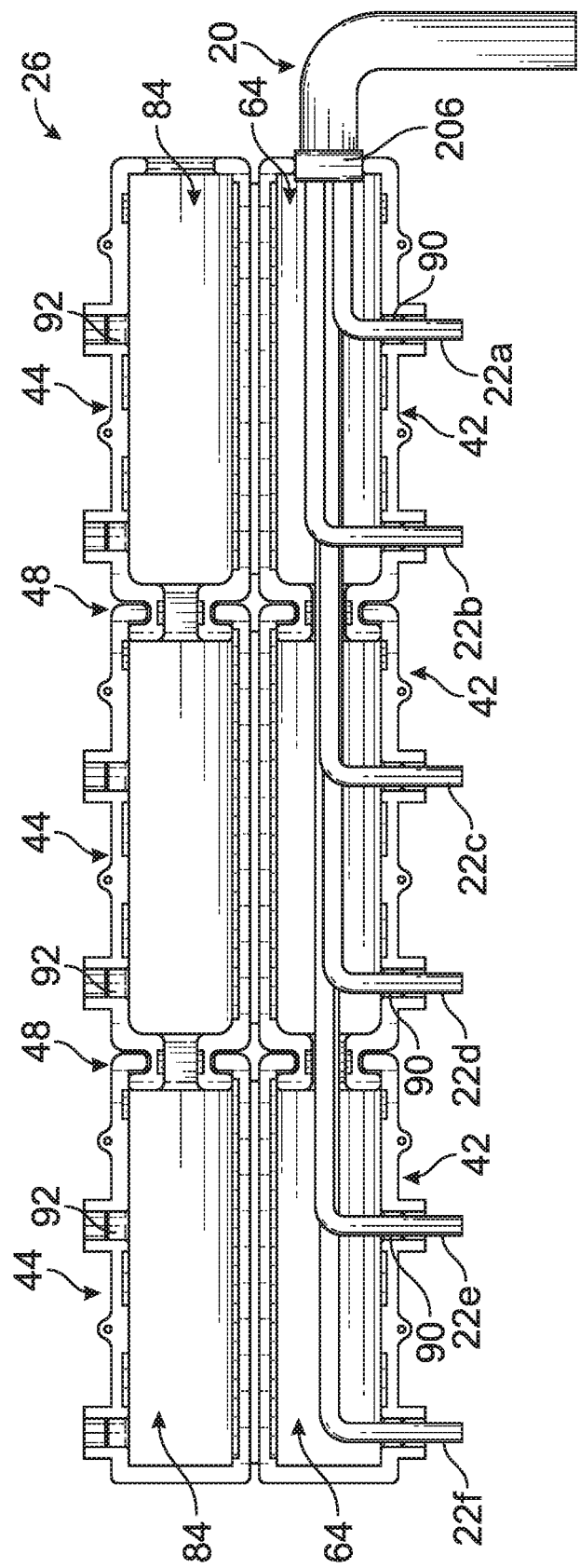
FIG. 6 depicts a top plan view of the embodiment of the spine shown in FIG. 4 in the open position and with the cable harness attached thereto.
Figure 7:
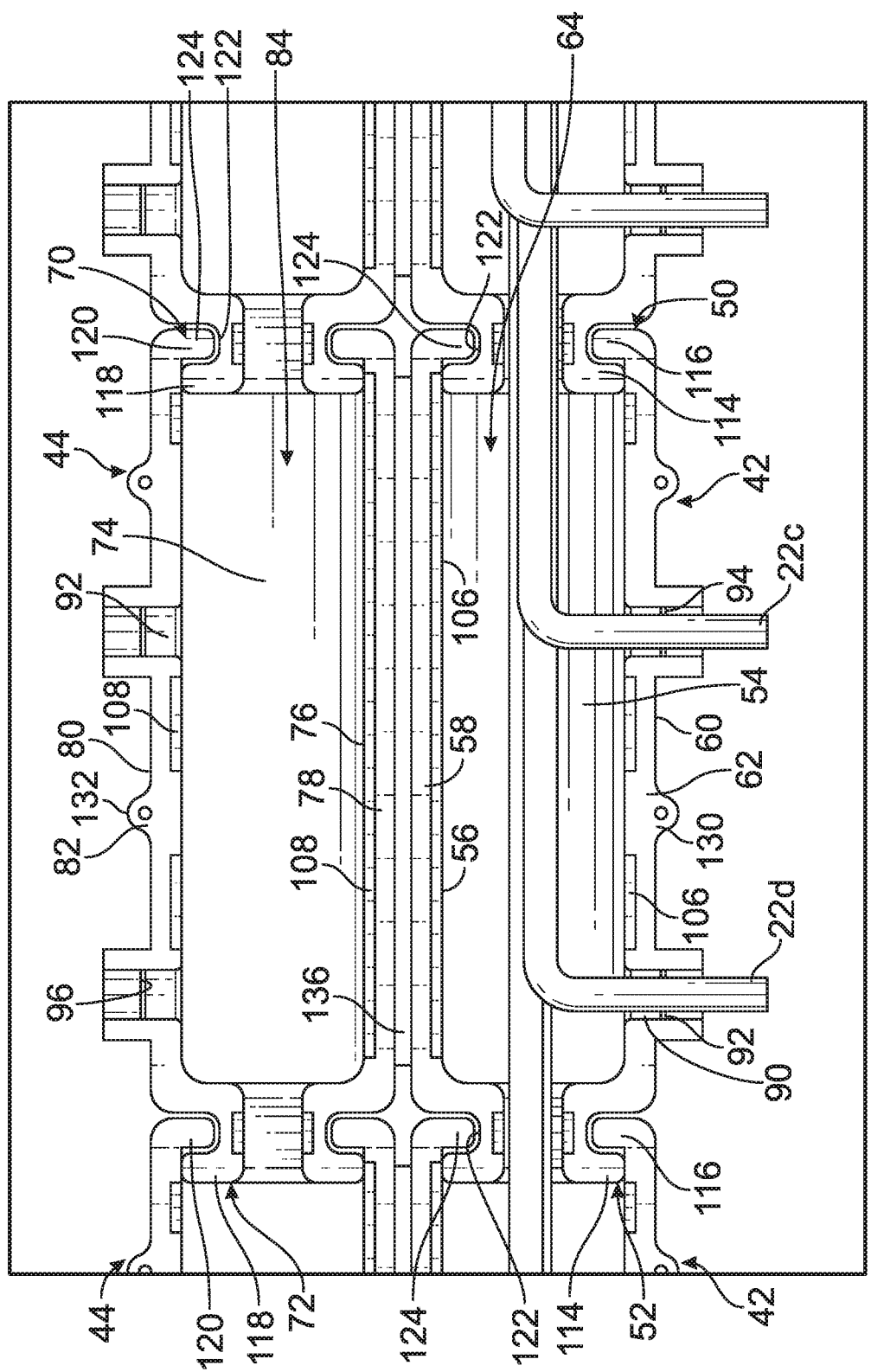
FIG. 7 depicts a partial, enlarged top plan view of the embodiment of the spine shown in FIG. 4 in the open position and with the cable harness attached thereto.
Figure 8:
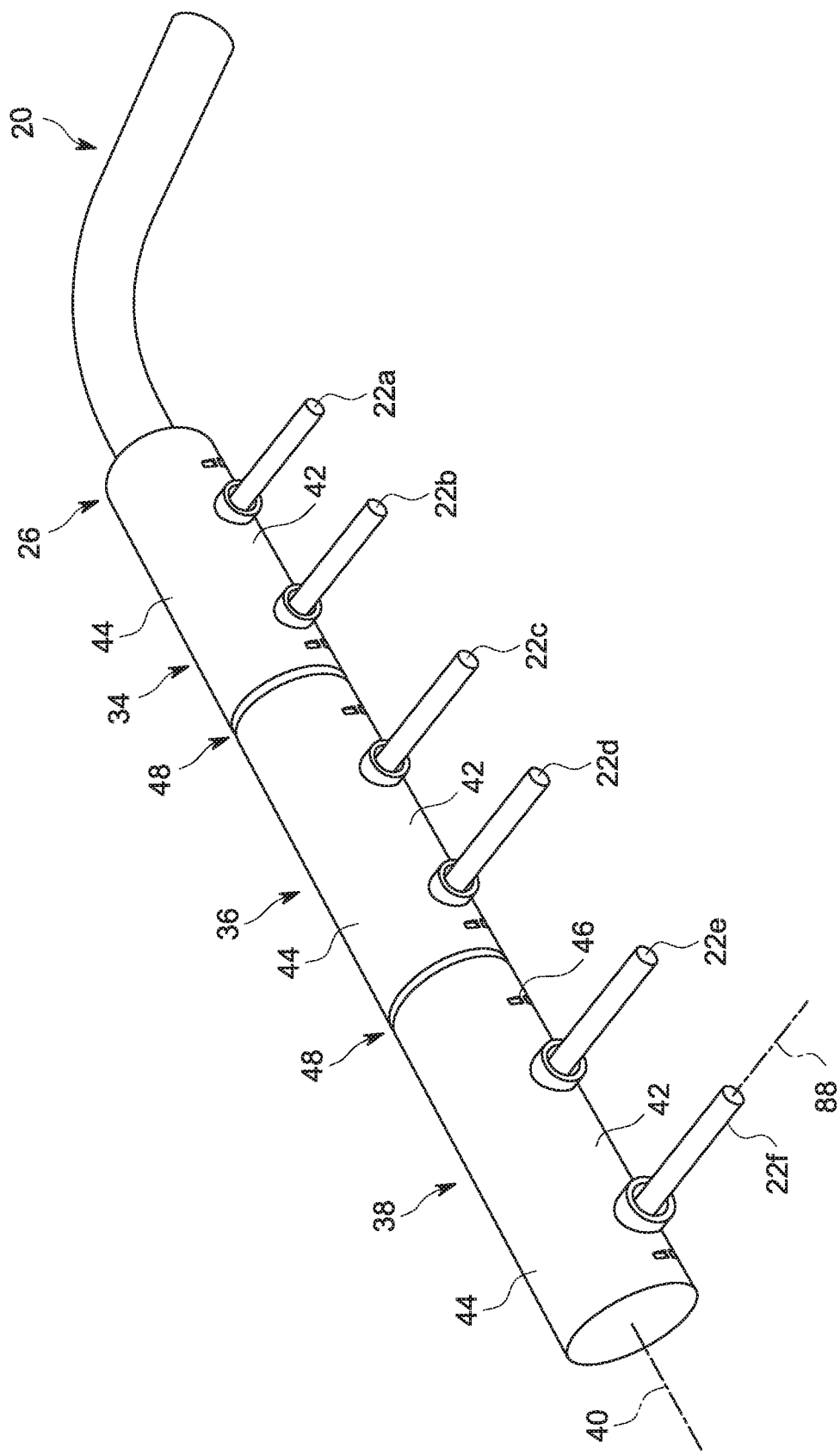
FIG. 8 depicts a perspective view of another embodiment of the spine and with a cable harness attached thereto.
Figure 9:
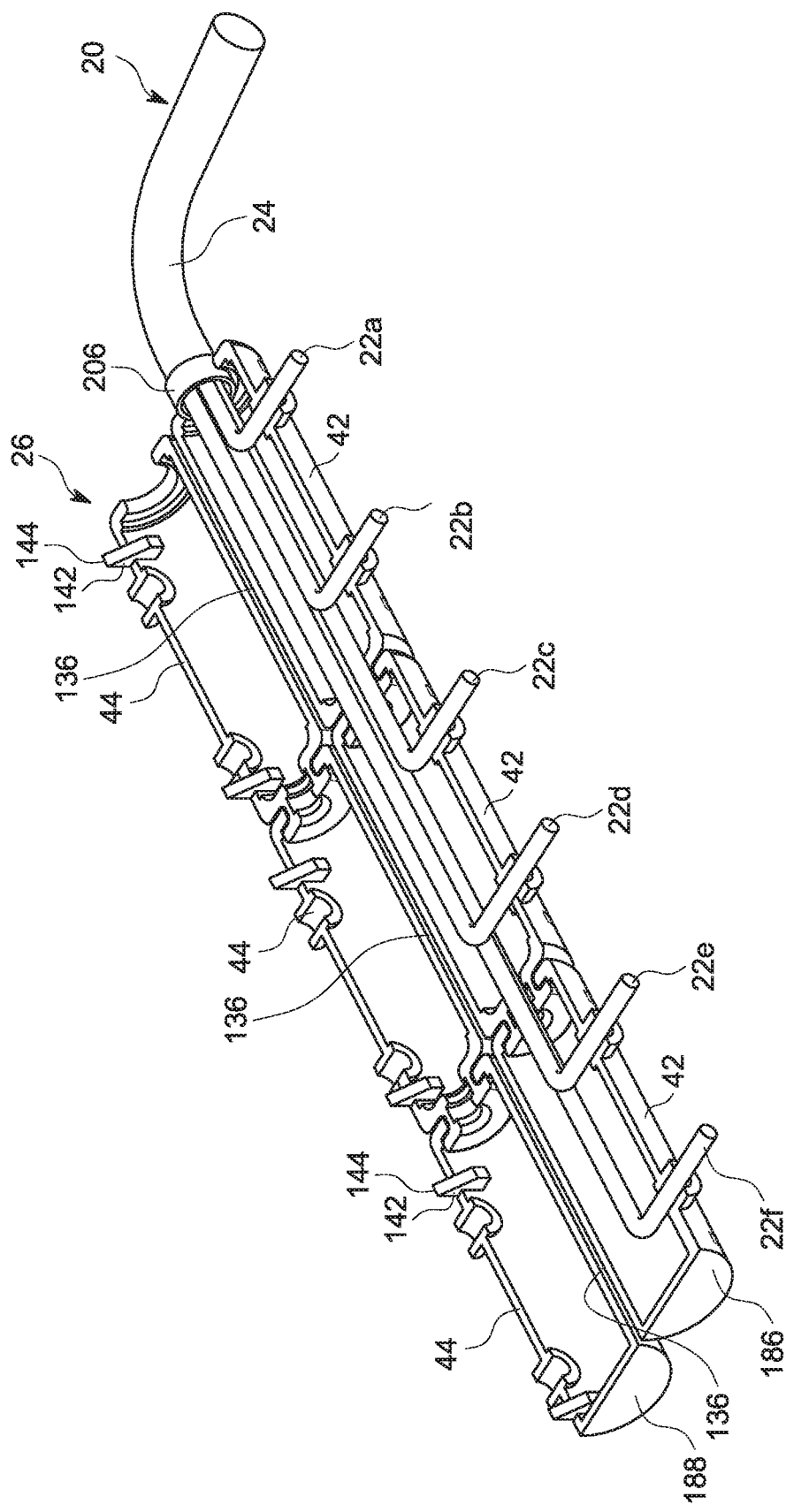
FIG. 9 depicts a perspective view of the embodiment of the spine shown in FIG. 8 in an open position and with the cable harness attached thereto.
Figure 10:
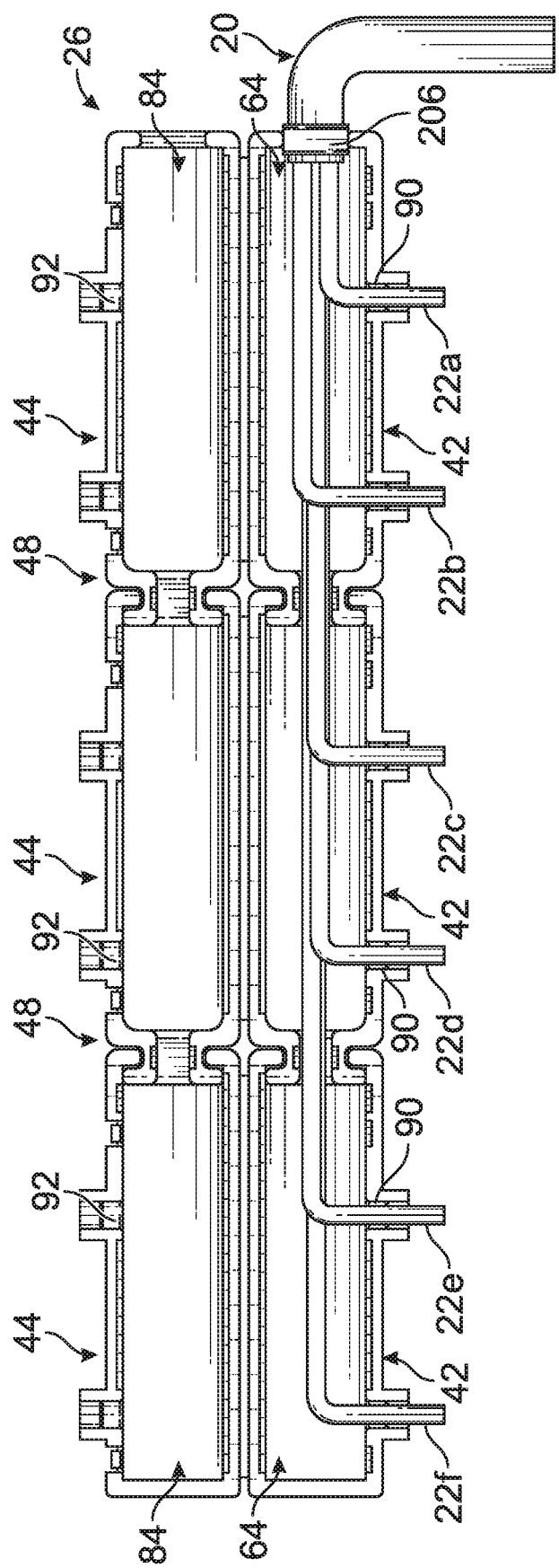
FIG. 10 depicts a top plan view of the embodiment of the spine shown in FIG. 8 in the open position and with the cable harness attached thereto.
Figure 11:
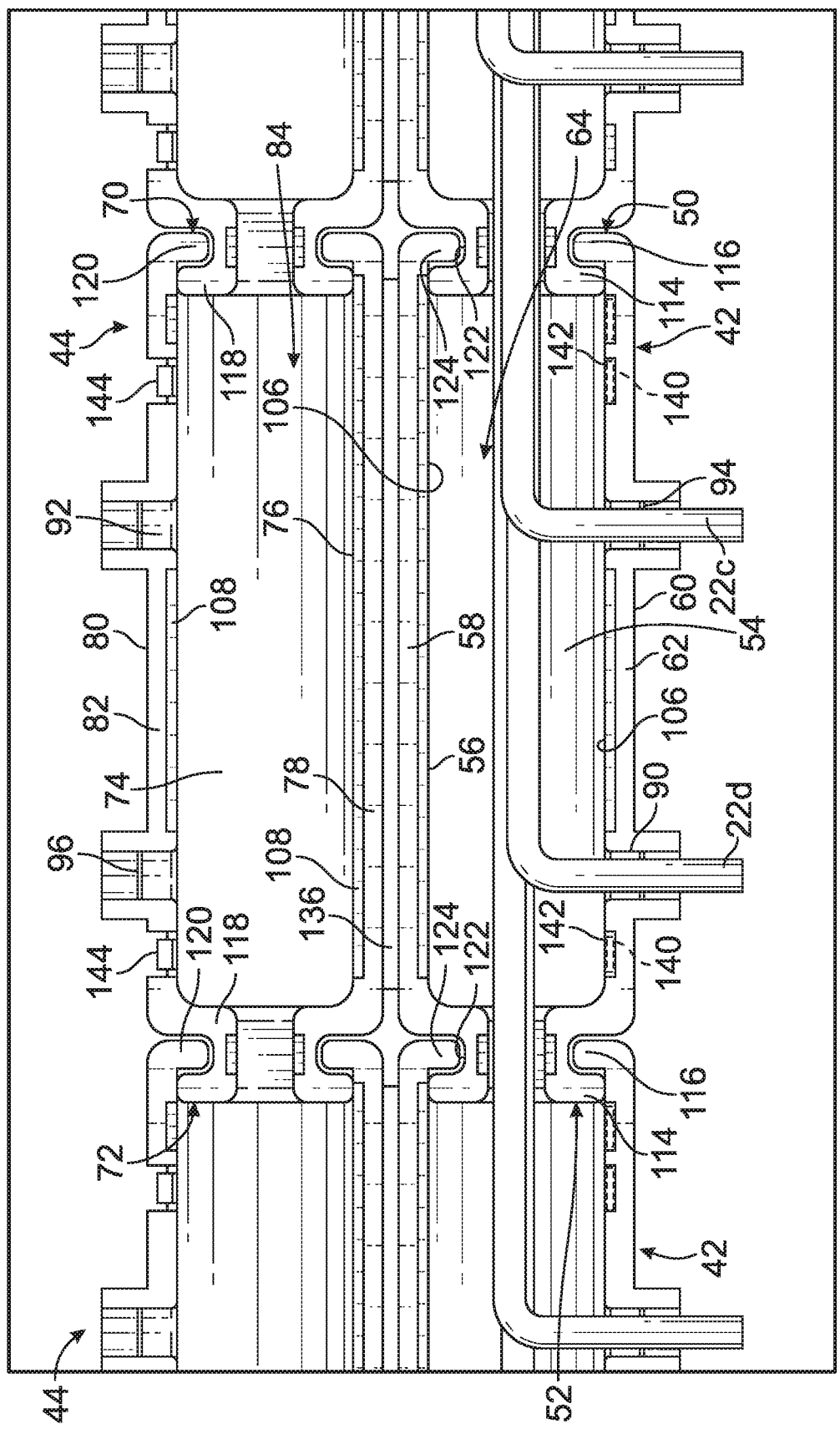
FIG. 11 depicts a partial, enlarged top plan view of the embodiment of the spine shown in FIG. 8 in the open position and with the cable harness attached thereto.
Figure 12:
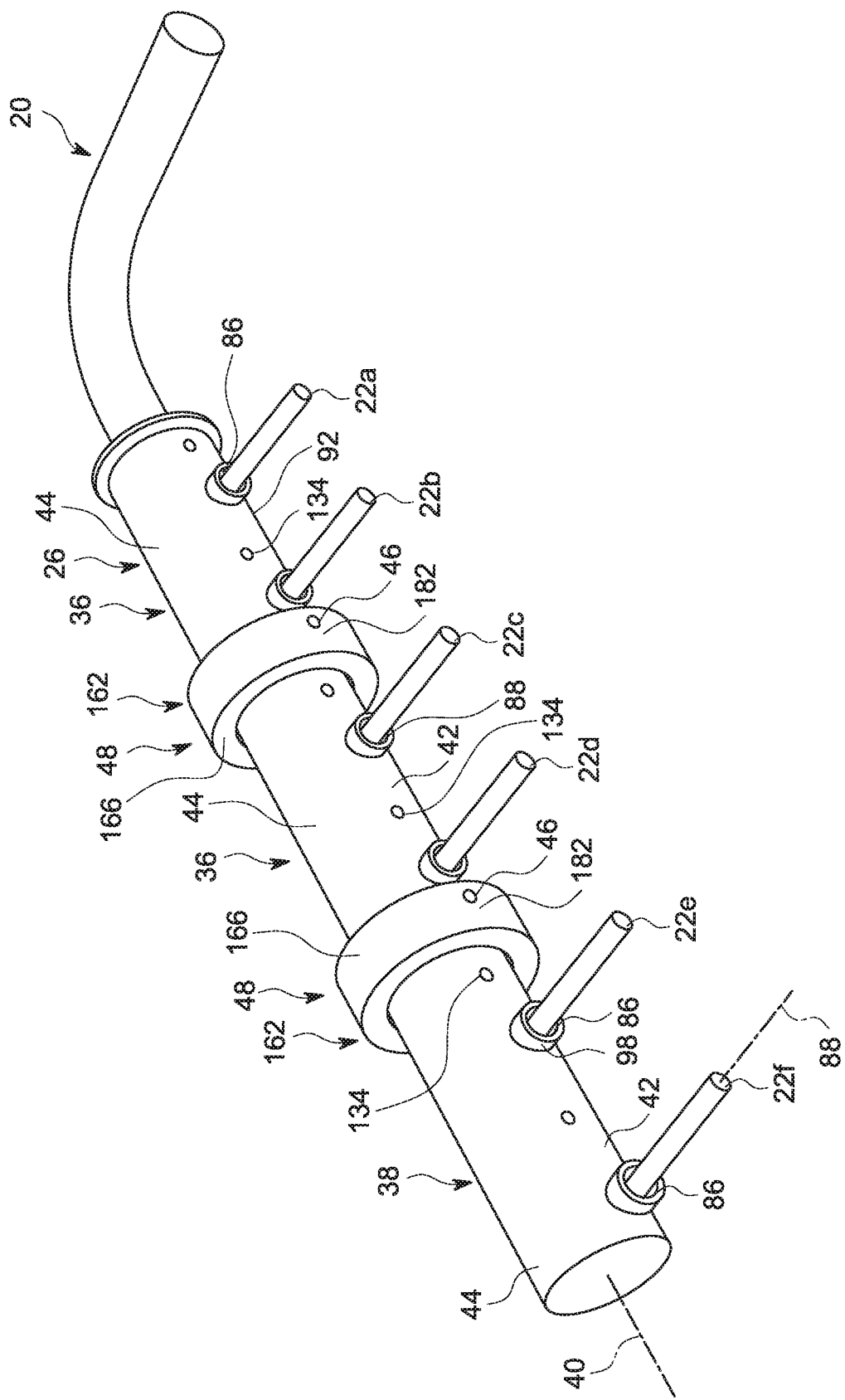
FIG. 12 depicts a perspective view of yet another embodiment of the spine and with a cable harness attached thereto.

Cable harnesses 20 typically used in computer rack architecture have a plurality of bundled cables 22a-22l which are surrounded by a common member 24, such as an insulative jacket. The cable harness 20 includes electrical interconnects terminated at each respective end. Each cable 22a-22l has its own insulative jacket which electrically isolates the individual cable from the other cables in the cable harness 20 and furthermore each cable has its own conductive layer within the insulative jacket that isolates the individual cable substantially from electromagnetic interference associated with other cables located within the common member. The other cables in the common member are, by reciprocity, shield substantially from the subject cable as well. The common member 24 can be removed to expose the bundled cables 22a-22l. A spine 26 is provided by the present disclosure for protecting and supporting the cable harness 20 for the management of the individual cables 22a-22l so that the individual cables 22a-22l can be routed to different locations. While twelve cables 22a-22l are shown in FIGS. 1-3 and six cables 22a-22f are shown in several of the other drawings, more or fewer cables can be used with the spine 26. The spine 26 is especially useful in routing cables 22a-22l for use in transmitting signals in computer racks 28 in data centers, or for routing power to computer racks 28 in data centers. An example computer rack 28 is shown in FIG. 1 with two of the spines 26 being used therewith. Typically, the computer rack 28 includes a switch 30 that interconnects individual servers 32a-32l, routers or relays in a rack to an aggregation switch (not shown). The switch 30 can be mounted at the "Top of the Rack" or "Middle of the Rack" and includes a passage or channel to route the cables necessary for the communication network. The computer rack 28 is generally assembled and built on site. Like reference numerals in the various embodiments shown herein are denoted with like reference numerals.

The spine 26 includes at least two segments 34, 36, 38 arranged along an axis 40 and coupled together. Each segment 34, 36, 38 includes a first housing part 42 and a second housing part 44 which can be mated together and locked together by a releasable lock 46. Adjacent segments are coupled to each other by a coupling 48 and form a central passageway therethrough which defines the axis 40. Three interconnected segments are shown in FIGS. 4-22 and include entry segment 34 into which the cable harness 20 first enters a middle segment 36 and an end segment 38. It is to understood that more than three segments can be provided, which could include the entry segment 34, multiple middle segments 36 and the end segment 38. Since multiple middle segments 36 can be provided, this reduces the manufacturing cost by reducing the mold cost. It is to understood that only two segments can be provided which would include the entry segment 34 and the end segment 38. In any of the embodiments, the end segment 38 can instead be provided by a middle segment 36. Each housing part 42, 44 is rigid and is formed from an insulative material, such as plastic or similar polymer.

Each first housing part 42 has a front end 50, an opposite rear end 52, a base wall 54 extending from the front end 50 to the rear end 52, a first side wall 56 extending from the base wall 54 to a first free end at which an end surface 58 is formed, the first side wall 56 extending from the front end 50 to the rear end 52, a second side wall 60 extending from the base wall 54 to a second free end at which an end surface 62, the second side wall 60 extending from the front end 50 to the rear end 52. The base wall 54 and the side walls 56, 60 form a cavity 64 which extends longitudinally from the front end 50 to the rear end 52. A central axis of the cavity 64 is defined from the front end 50 to the rear end 52. Each end surface 58, 62 extends longitudinally from the front end 50 to the rear end 52. In an embodiment, the end surfaces 58, 62 are in the same plane, however, the end surfaces 58, 62 may be in different planes. In an embodiment, the base wall 54 and the side walls 56, 60 are curved at a constant radius. Other shapes for the base wall 54 and the side walls 56, 60 are within the scope of the present disclosure. The cavity 64 has a constant radius along the length of the cavity 64.

Each second housing part 44 has a front end 70, an opposite rear end 72, a base wall 74 extending from the front end 70 to the rear end 72, a first side wall 76 extending from the base wall 74 to a first free end at which an end surface 78 is formed, the first side wall 76 extending from the front end 70 to the rear end 72, a second side wall 80 extending from the base wall 74 to a second free end at which an end surface 82, the second side wall 80 extending from the front end 70 to the rear end 72. The base wall 74 and the side walls 76, 80 form a cavity 84 which extends longitudinally from the front end 70 to the rear end 72. A central axis of the cavity 84 is defined from the front end 70 to the rear end 72. Each end surface 78, 82 extends longitudinally from the front end 70 to the rear end 72. In an embodiment, the end surfaces 78, 82 are in the same plane, however, the end surfaces 78, 82 may be in different planes. In an embodiment, the base wall 74 and the side walls 76, 80 are curved at a constant radius. Other shapes for the base wall 74 and the side walls 76, 80 are within the scope of the present disclosure. The cavity 84 has a constant radius along the length of the cavity 84.

When the housing parts 42, 44 are mated together to form the segment 34, 36, 38, end surface 58 of the first housing part 42 abuts against end surface 78 of the second housing part 44, and end surface 62 of the first housing part 42 abuts against end surface 82 of the second housing part 44. The front ends 50, 70 align and the rear ends 52, 72 align. The cavities 64, 84 align to form a passageway therethrough which extends from the front ends 50, 70 to the rear ends 52, 72 of each segment 34, 36, 38.

Figure 22:
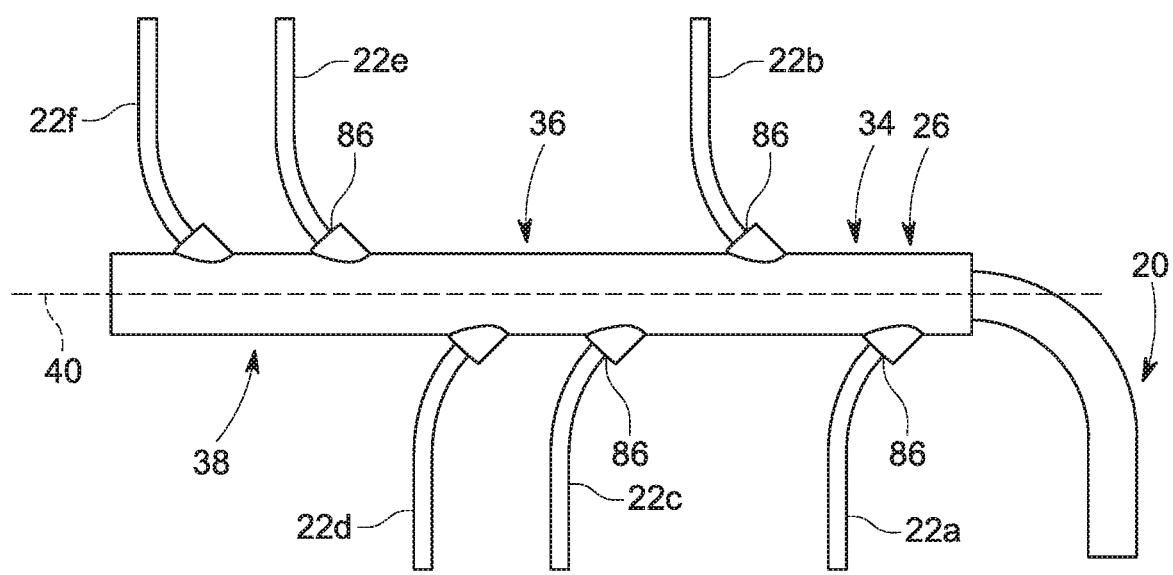
FIG. 22 depicts a top plan view of an even further embodiment of the spine and with a cable harness attached thereto.

Each segment 34, 36, 38 has at least one opening 86 therethrough which is in communication with the passageway formed by the adjoined cavities 64, 84 to form an exit port(s) for a cable 22a-22f of the cable harness 20 to pass therethrough. While the drawings show two openings 86 for each segment 34, 36, 38, a single opening may provided in one or all of the segments 34, 36, 38, or one, two or more than two openings may provided in one or all of the segments 34, 36, 38. That is, the spine 26 is not limited to each segment 34, 36, 38 having the same number of openings 86. This forms a branch path for the cable 22a-22f for routing to the appropriate location in the rack 28. Each opening 86 has an axis 88 which at an angle relative to the axis of the central passageway formed by the adjoined cavities 64, 84 which is defined by axis 40. In an embodiment, the axis 88 of each opening 86 is angled at 90 degrees relative to the longitudinal axis 40 of the passageway formed by the adjoined cavities 64, 84 as shown in FIGS. 1, 2 and 4-21. In an embodiment, the walls forming the opening 86 are radiused so that the bend radius of the cable 22a-22f passing therethrough is controlled and the cables 22a-22f exit the spine 26 at 90 degrees relative to the longitudinal axis 40. In embodiments, the axis 88 is angled at angles between 0 and 90 degrees relative to the axis 40. As an example, the axis 88 of each opening 86 is angled at 45 degrees relative to the longitudinal axis 40 as shown in FIGS. 3 and 22. The pitch of the branch path can be precisely controlled and the pitch of all branch paths may be uniformly set. When the spine 26 is formed by joining adjacent segments 34, 36, 38, the passageways through each segment 34, 36, 38 align to form the central passageway having the axis 40.

In an embodiment as shown in the drawings, a first section 90 of the opening 86 is provided in the side wall 60 of the first housing part 42 and extends from the end surface 62 toward the base wall 54, and a second section 92 of the opening 86 is provided in the side wall 80 of the second housing part 44 and extends from the end surface 82 toward the base wall 74. When the housing parts 42, 44 are mated together, the sections 90, 92 align to form the complete opening 86.

In an embodiment, a cable retaining rib(s) 94, 96 extends across a portion of at least one of the sections 90, 92 to partially fill the section 90, 92. The cable retaining rib(s) 94, 96 does not extend the full height of the section 90, 92 such that the cable retaining rib(s) 94, 96 is recessed from the end surface 62, 82. In an embodiment, two cable retaining ribs are provided in each section 90, 92 and extend parallel to the longitudinal axis of the respective cavity 64, 84. When the housing parts 42, 44 are mated together to form the complete opening 86, the cable retaining rib(s) 94, 96 will bite into a cable 22a-22f seated within the openings 86.

In an embodiment, only section 90 is provided and when the housing parts 42, 44 are mated together, the section 90 aligns with a portion of the end surface 82 of the second housing part 44. In an embodiment, only section 92 is provided and when the housing parts 42, 44 are mated together, the section 92 aligns with a portion of the end surface 62 of the first housing part 42. In each embodiment, the portion of the end surface 82, 62 that aligns with the section 90, 92 may have a reduced thickness from the remainder of the side wall 80, 60 to form cable retaining rib(s).

In an embodiment, a branch wall 98 extends outwardly from the side wall 60 and forms a portion of the opening 86. The branch wall 98 may mirror the shape of the opening 86. If provided, the branch wall 98 provides support for the cable 22a-22f being routed through the opening 86. It is to be understood that the branch wall 98 may be eliminated. In an embodiment, the branch wall 98 has a first wall portion 100 extending from side wall 60 and a second wall portion 102 extending from side wall 80. The wall portions 100, 102 mate together at ends thereof to further form the opening 86.

Each housing part 42, 44 may have a conductive metallic surface 104, see FIG. 20, provided on the surfaces forming the cavities 64, 84, the end surfaces 58, 62, 78, 82 which mate together and any cable retaining rib(s) 94, 96. This metallic surface 104 may be formed by plating, or metallizing the plastic. This conductive metallic surface 104 assists in electromagnetic (EMI) shielding for the cables 22a-22f passing therethrough.

Each housing part 42, 44 may have mating alignment features which assist in properly aligning the housing parts 42, 44 for when the housing parts 42, 44 are mated together. In an embodiment, the mating alignment features takes the form of a plurality of elongated recesses 106 in the first housing part 42 into which elongated ribs 108 on the second housing part 44 seat. The recesses 106 extend from the end surfaces 58, 62 toward the base wall 54. The ribs 108 extend outwardly from the end surfaces 78, 82. It is to be understood that the recesses 106 can be provided the second housing part 44 and the ribs 108 provided on the first housing part 42.

When the spine 26 is formed using segments 34, 36, 38 as shown, the rear ends 52, 72 of the housing parts 42, 44 of the segment 34 are attached to the front ends 50, 70 of the housing parts 42, 44 of the segment 36 by the coupling 48, and the rear ends 52, 72 of the housing parts 42, 44 of the segment 36 are attached to the front ends 50, 70 of the housing parts 42, 44 of the segment 38 by the coupling 48.

In the embodiments shown in FIGS. 4-11, each coupling 48 is formed by a rear flange portion 114 which extends from the rear end 52 of the first housing part 42 of each segment 34, 36, a front flange portion 116 which extends from the front end 50 of the first housing part 42 of each segment 34, 36, a rear flange portion 118 which extends from the rear end 72 of the second housing part 44 of each segment 34, 36, and a front flange portion 120 which extends from the front end 70 of the second housing part 44 of each segment 34, 36. The flange portions 114, 116 interlock with each, and the flange portions 118, 120 interlock with each. The flange portions 114, 116, 118, 120 may be formed such that the flange portions 114, 116, 118, 120 extend around the perimeter of the housing parts 42, 44 such that when the housing parts 42, 44 are mated together, a continuous flange is provided between the segments 34, 36, 38. This will allow for rotation of the segments 34, 36, 38 relative to each other such that the position of the openings 86 do not need to align from segment to segment as shown in FIGS. 21 and 22. In an embodiment, flange portions 114, 118 have a pocket 122 in which a hooked end 124 of the flange portions 116, 120 seat to form the couplings 48.

In some embodiments of FIGS. 3-6, the lock 46 is formed by at least one fastener receiving boss 130 provided in the side wall 60 of the first housing part 42, and at least one fastener receiving boss 132 provided in the side wall 80 of the second housing part 44. When the housing parts 42, 44 are mated together, the respective bosses 130, 132 align with each other. A fastener 134 is received through respective aligned bosses 130, 132 to secure the housing parts 42, 44 together and complete the lock 46. At least one fastener receiving boss (not shown) may be provided in the side wall 58 of the first housing part 42, and at least one fastener receiving boss (not shown) may be provided in the side wall 76 of the second housing part 44 through which a fastener (not shown) is received to secure the side walls 58, 78 together. Alternatively, a hinge 136 is provided between the side walls 58, 78 to allow the housing parts 42, 44 to always remain connected to each other, while allowing the housing parts 42, 44 to rotate relative to each other. The fasteners 134 may be self-tapping screws.

In the embodiments of FIGS. 8-11, the lock 46 is formed by at least one recess 140 through the side wall 60 of the first housing part 42 and at least one flexible latch finger 142 having a hooked end 144 extending from the end surface 82 of the side wall 80 of the second housing part 44. When the housing parts 42, 44 are mated together, the latch fingers 142 flex upon contact with the end surface 62 and then the hooked ends 144 slide along an inner surface of the side wall 60 until the hooked ends 144 seats within the respective recesses 140 to complete the lock 46. At least at least one recess (not shown) may be provided in the side wall 58 of the first housing part 42, and at least one least one flexible latch finger 142 having a hooked end 144 may extend from the side wall 76 of the second housing part 44 and can be mated together. Alternatively, the hinge 136 is provided between the side walls 58, 78 to allow the housing parts 42, 44 to always remain connected to each other, while allowing the housing parts 42, 44 to rotate relative to each other. The flexible latch finger 142 may have the conductive metallic surface 104 provided thereon.

In the embodiments shown in FIGS. 12-19, each coupling 48 is formed by a rear flange portion 154 which extends outwardly from the rear end 52 of the first housing part 42 of each segment 34, 36, a front flange portion 156 which extends outwardly from the front end 50 of the first housing part 42 of each segment 34, 36, a rear flange portion 158 which extends outwardly from the rear end 72 of the second housing part 44 of each segment 34, 36, a front flange portion 160 which extends outwardly from the front end 70 of the second housing part 44 of each segment 34, 36, and a separate collar 162 in which the flange portions 154, 156, 158, 160 are seated. The flange portions 154, 156 are adjacent to each other, and the flange portions 158, 160 are adjacent to each other. The flange portions 154, 156, 158, 160 may extend radially outwardly from the housing parts 42, 44 and may extend around the perimeter of the housing parts 42, 44 such that when the housing parts 42, 44 are mated together and seated within the collar 162, a continuous flange is provided between the segments 34, 36, 38. This will allow for rotation of the segments 34, 36, 38 relative to each other such that the position of the openings 86 do not need to align from segment to segment as show in FIGS. 21 and 22. In an embodiment, flange portions 114, 118 have a pocket 122 in which a hooked end 124 of the flange portions 116, 120 seat to form the couplings 48.

Figure 13:
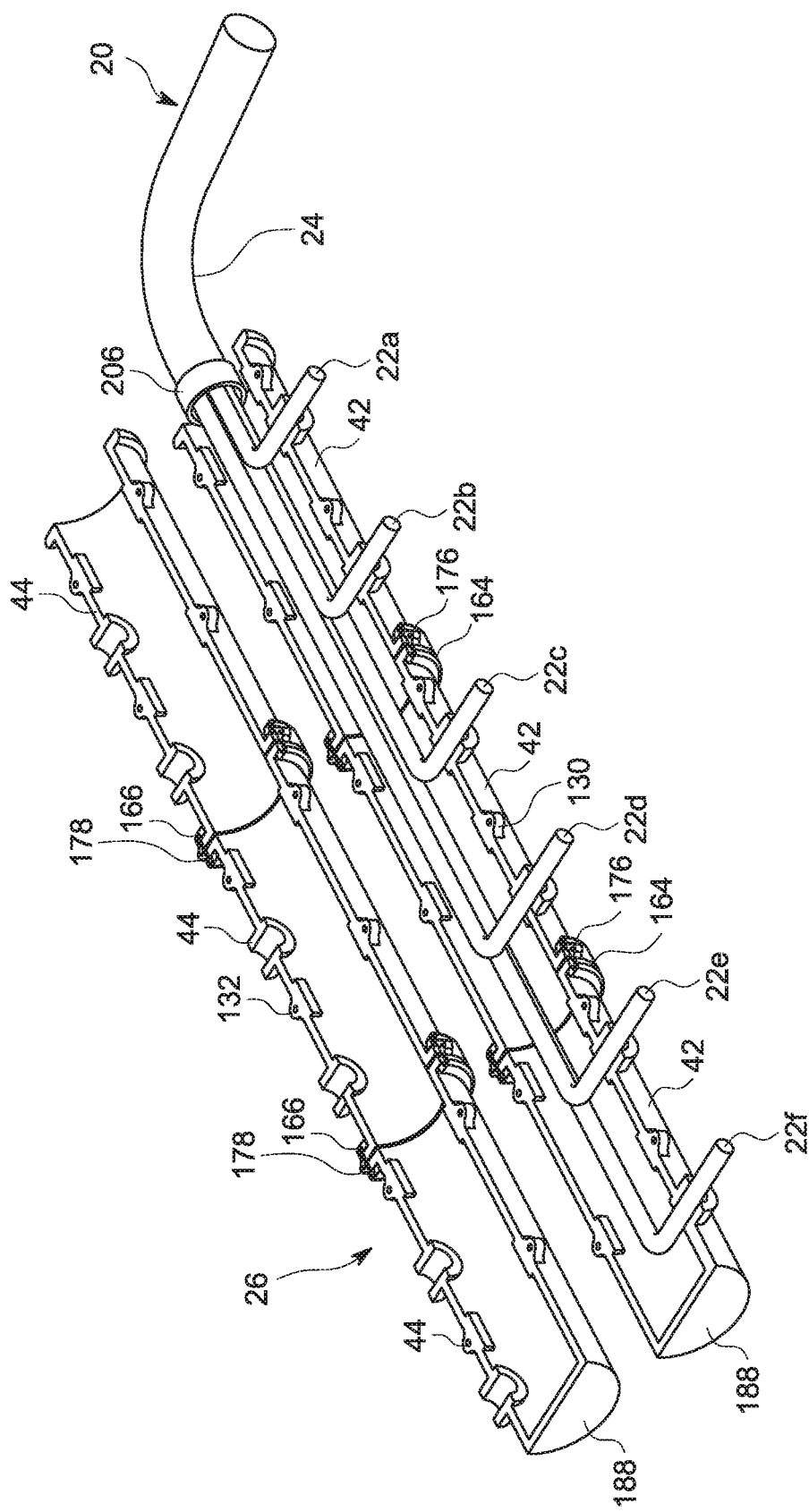
FIG. 13 depicts a perspective view of the embodiment of the spine shown in FIG. 12 in an open position and with the cable harness attached thereto.
Figure 14:
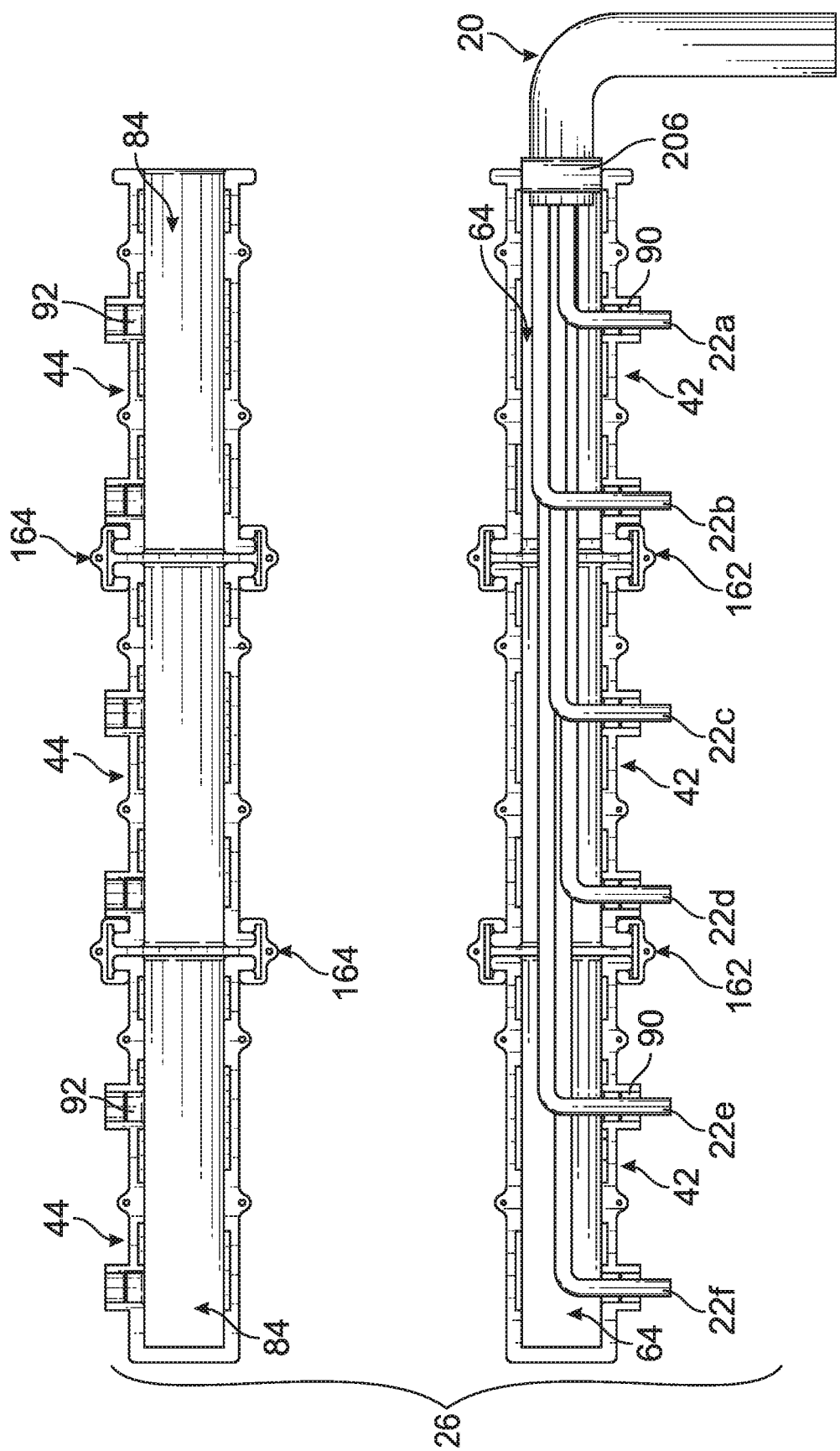
FIG. 14 depicts a top plan view of the embodiment of the spine shown in FIG. 12 in the open position and with the cable harness attached thereto.
Figure 15:
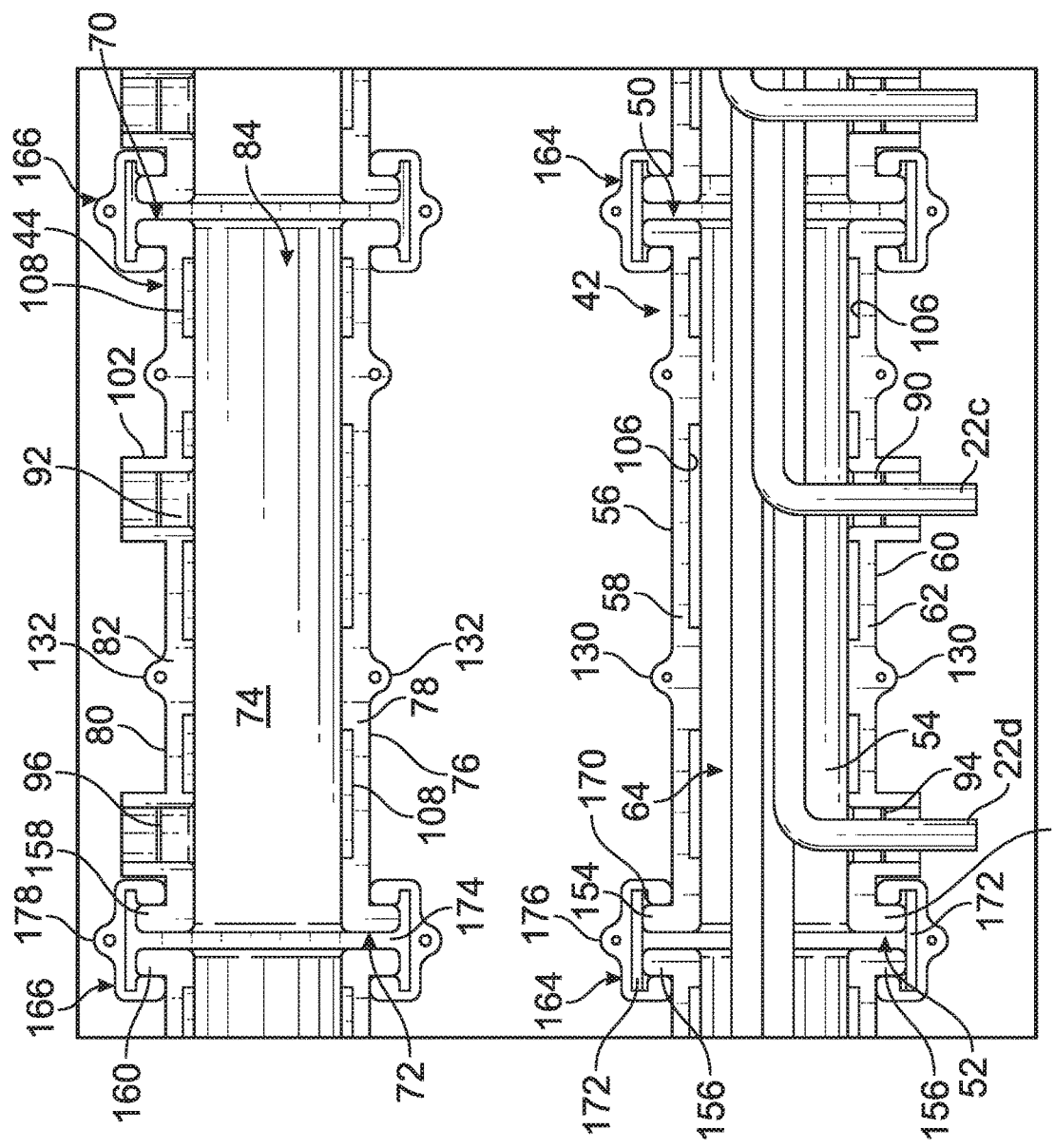
FIG. 15 depicts a partial, enlarged top plan view of the embodiment of the spine shown in FIG. 12 in the open position and with the cable harness attached thereto.
Figure 16:
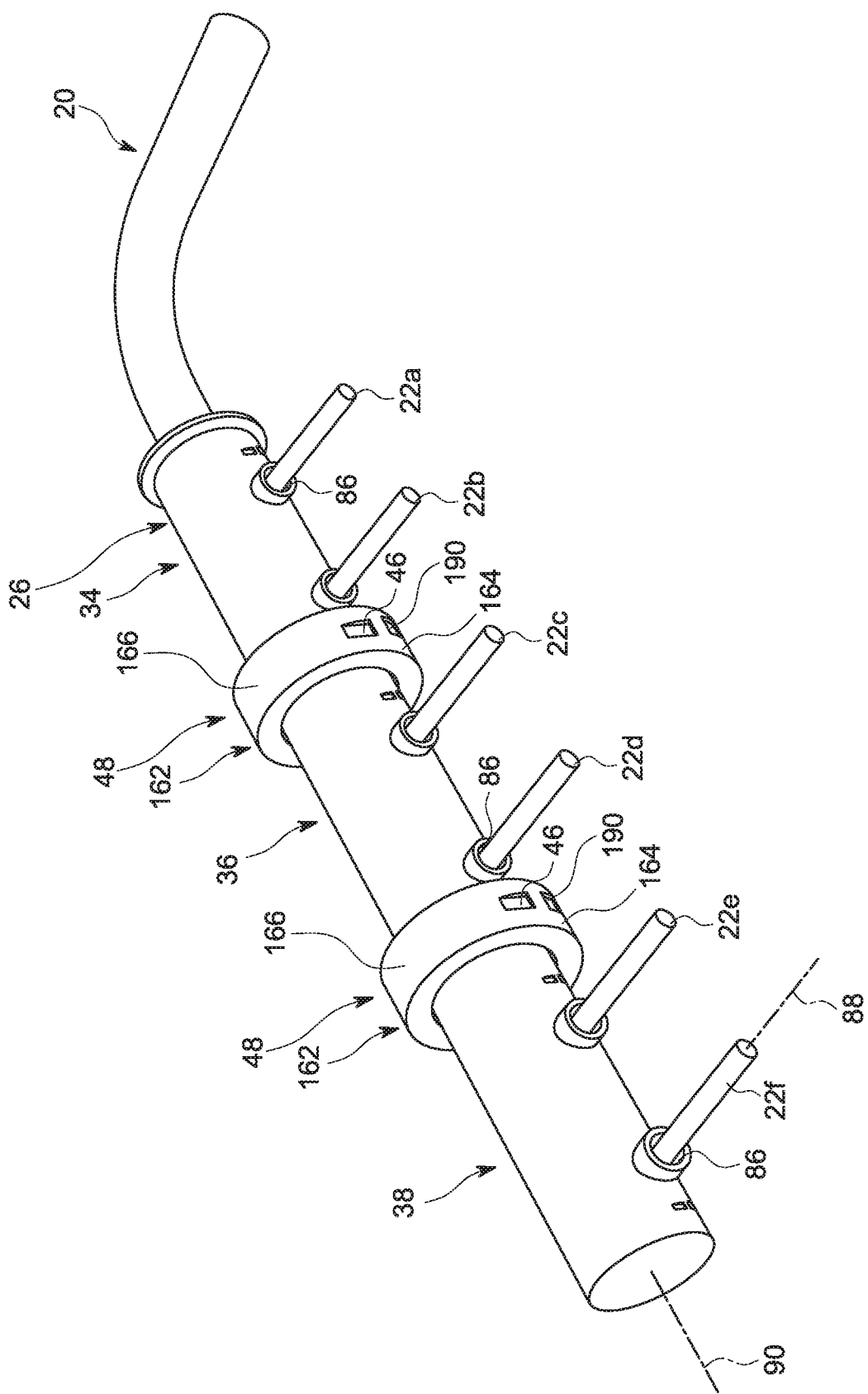
FIG. 16 depicts a perspective view of yet another embodiment of the spine and with a cable harness attached thereto.
Figure 17:
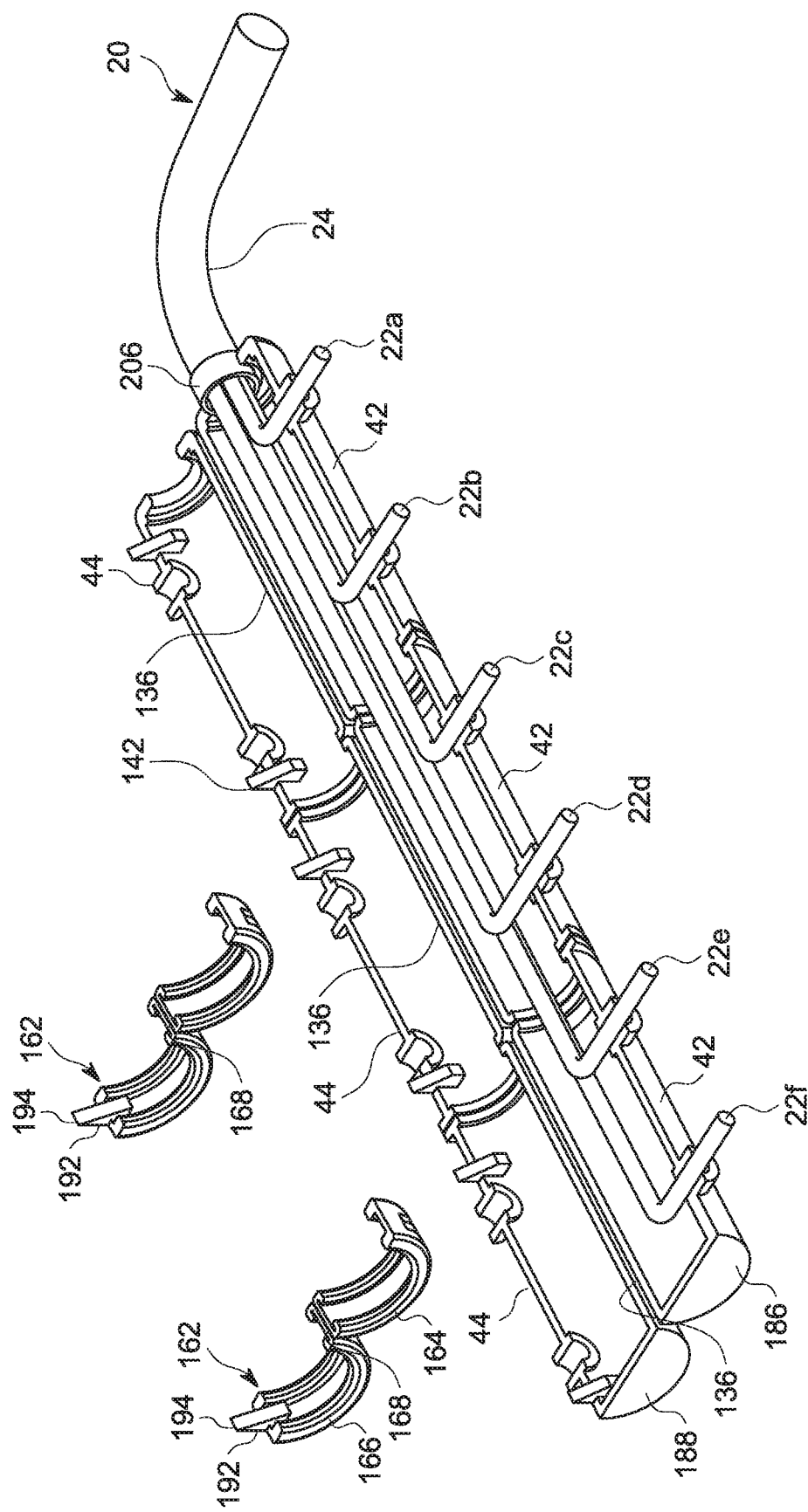
FIG. 17 depicts a perspective view of the embodiment of the spine shown in FIG. 16 in an open position and with the cable harness attached thereto.
Figure 18:
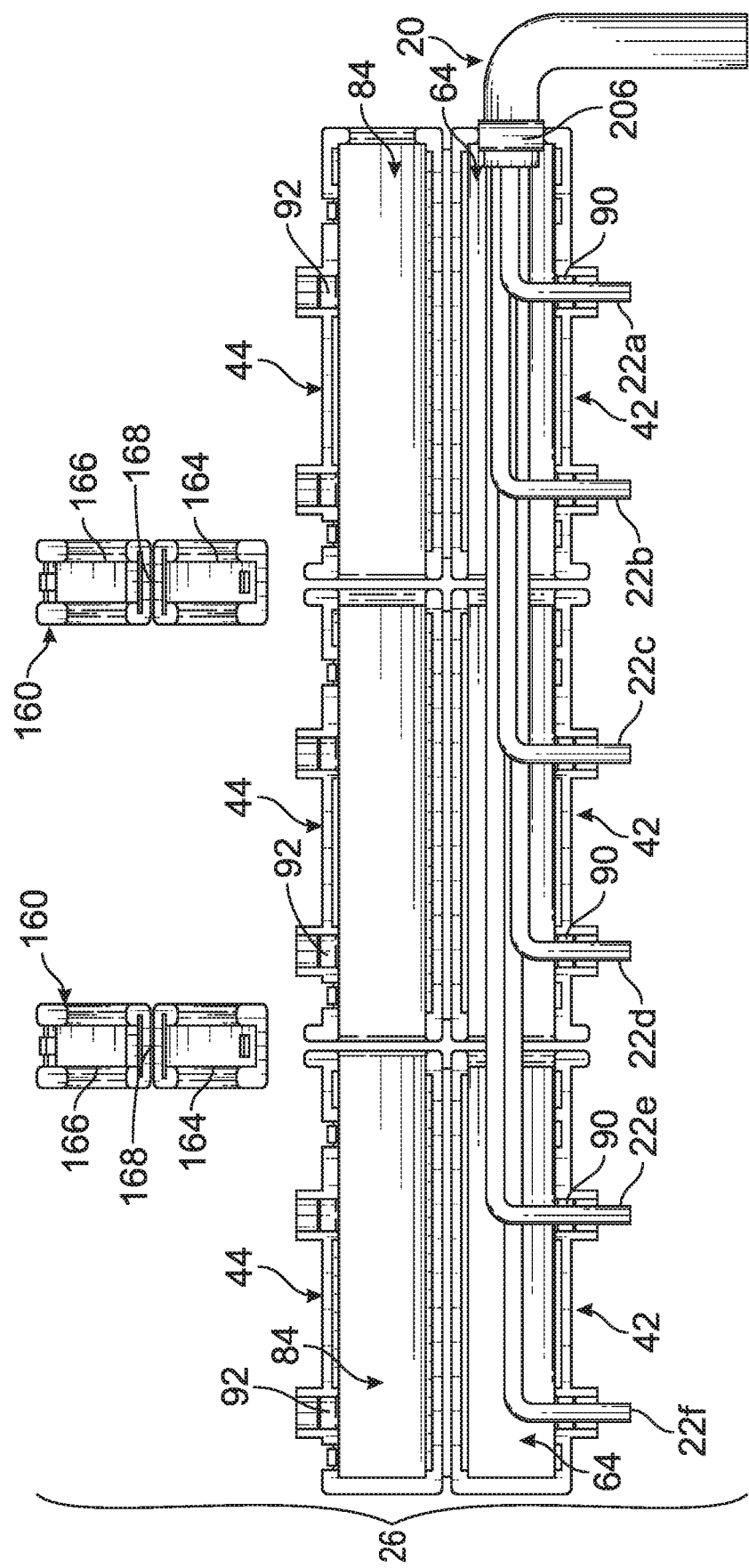
FIG. 18 depicts a top plan view of the embodiment of the spine shown in FIG. 16 in the open position and with the cable harness attached thereto.
Figure 19:
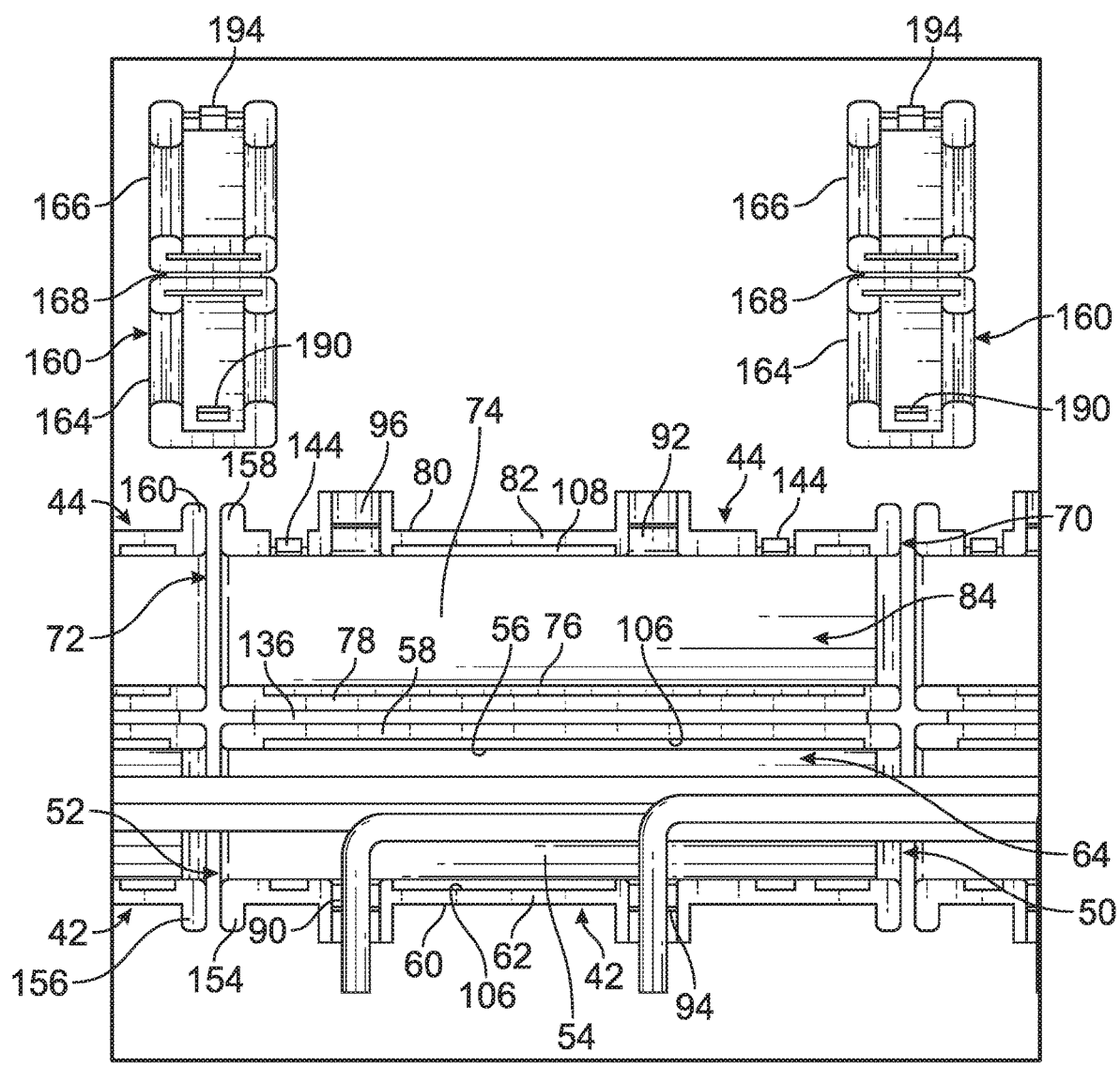
FIG. 19 depicts a partial, enlarged top plan view of the embodiment of the spine shown in FIG. 16 in the open position and with the cable harness attached thereto.

The collar 162 may be formed of a first collar part 164 attached to the first housing part 42 and a second collar part 166 attached to the second housing part 44 and which are mated together. The collar parts 164, 166 may be separate from each other as shown in FIGS. 13-15, or may be connected to each other by a hinge 168 as shown in FIGS. 17-19. Each collar part 164, 166 is rigid and may be formed from an insulative material such as plastic. Each collar part 164 is formed of a wall having an inner surface that mirrors the shape of an outer surface of the first housing part 42. A pocket 170 is formed in the wall and extends from an inner surface of the first collar part 164. The pocket 170 is sized to accept the flange portions 154, 156 therein. A rib 172 extends from each end surface of the first collar part 164. Each second collar part 166 is formed of a wall having an inner surface that mirrors the shape of an outer surface of the second housing part 44. A pocket 174 is formed in the wall and extends from an inner surface of the second collar part 166. The pocket 174 is sized to accept the flange portions 158, 160 and the ribs 172 therein. In an embodiment, the pocket 174 is T-shaped in cross-section. The collar parts 164, 166 surround the ends of the housing parts 42, 44 of the adjacent segments when the collar parts 164, 166 are mated together. The ribs 172 seat within the pocket 174.

In some embodiments, a clearance space may be provided between the flange portions 154, 156 when the flange portions 154, 156 are seated in the pocket 170 and a clearance space may be provided between the flange portions 158, 160 when the flange portions 158, 160 are seated in the pocket 174 to allow for articulation in a rotational and longitudinal direction between the adjacent segments 34, 36, 38 when the cable 22a-22f are seated therein. The clearance spaces allow for some freedom of motion between adjacent segments and account for misalignment and easier installation.

In the embodiments of FIGS. 12-15, the lock 46 is formed by at least one fastener receiving boss 176 provided in the first collar part 164 attached to the first housing part 42, and at least one fastener receiving boss 178 provided in the second collar part 166 attached to the second housing part 44. When the housing parts 42, 44 are mated together, the respective bosses 176, 180 align with each other. A fastener 182 is received through respective aligned bosses 176, 180 to secure the housing parts 42, 44 together and complete the lock 46. In the embodiments of FIGS. 16-19, the fastener receiving bosses 176, 178 are replaced by a recess 190 through the first collar part 164 and at least one flexible latch finger 192 having a hooked end 194 extending from the end surface of the second collar part 166. When the collar parts 164, 166 are mated together, the latch finger 142 flex and then hooked end 144 seats within the recess 190 to complete the lock 46.

As shown in FIGS. 12-15, fastener receiving bosses 130, like those provided in FIGS. 4-7, may additionally be provided in the side walls 56, 60 of the first housing part 42, and fastener receiving bosses 132, like those provided in FIGS. 4-7, may additionally be provided in the side walls 76, 80 of the second housing part 44 through which a fastener 134 is received to additionally secure the housing parts 42, 44 together and which may be considered to form part of the lock 46. Alternatively, as shown in FIGS. 16-19, the recess and the latch finger 140, 142 described herein with regard to FIG. 8-11 may be provided in place of the bosses 130, 132 as shown in FIGS. 12-15 to additionally secure the housing parts 42, 44 together and which may be considered to form part of the lock 46.

The collar 162 may be formed of metal, or may be formed of plastic having the conductive metallic surface 104 provided on all surfaces which face and/or engage the housing parts 42, 44.

In any of the embodiments, the entry segment 34 may have flange portions 156, 160 at the front ends 50, 70 to form a front flange as shown in FIGS. 12-15, which may have the conductive metallic surface 104 provided thereon.

As shown, in some embodiments, the end segment 38 has an end wall 184 formed by a first end wall section 186 at the rear end 52 of the first housing part 42 and a second end wall section 188 at the rear end 72 of the second housing part 44. The end wall sections 186, 188 abut against each other to close the rear ends 52, 72 of the mated housing parts 42, 44. This deters the entry of contaminants into the spine 26. As shown in FIG. 21, the end wall sections 186, 188 may have mating features 196, such as mating bosses 130, 132 and a fastener 134 as shown herein or mating recess and latch finger 140, 142 as shown herein. Alternatively, the end segment 38 can be provided with a middle segment 36 and an end cap (not shown) attached to the rear ends 52, 72 thereof. As shown in FIG. 3, the end segment 38 does not have the end wall sections 186, 188 and instead has an opening 198 through which the cable 22l extends. The opening 198 may have an axis which aligns with the axis 40.

As shown in FIGS. 21 and 22 and as described herein, the openings 86 do not all have to align with each other on one side of the spine 26. Any of the segments 34, 36, 38 can be rotated relative to each other to have the openings 86 in the segments 34, 36, 38 oriented in different directions. As an example, in FIG. 20 the openings 86 in segment 34 are offset 180 degrees from the openings 86 in the segments 36, 38 and in FIG. 21 the openings 86 in segment 36 are offset 180 degrees from the openings 86 in the segment 38. In addition, openings 86 in each segment 34, 36, 38 do not need to align with each other and can be at angles relative to each other in each segment 34, 36, 38. As shown in FIG. 21, the segment 34 has openings 86i which are 180 degrees relative to each other. It is to be understood that while two openings 86 are shown in in each segment 34, 36, 38, any of the segments 34, 36, 38 can have a single opening 86, two openings 86, or more than two openings 86.

As shown in FIG. 21, the spine 26 additionally includes a segment 200 which does not have openings 86 therein. The segment 200 is formed using the housing parts 42, 44, except that the openings 86 are eliminated. The segment 200 can be positioned at any place along the length of the spine 26, and more than one of the segments 200 can be provided.

Figure 23:
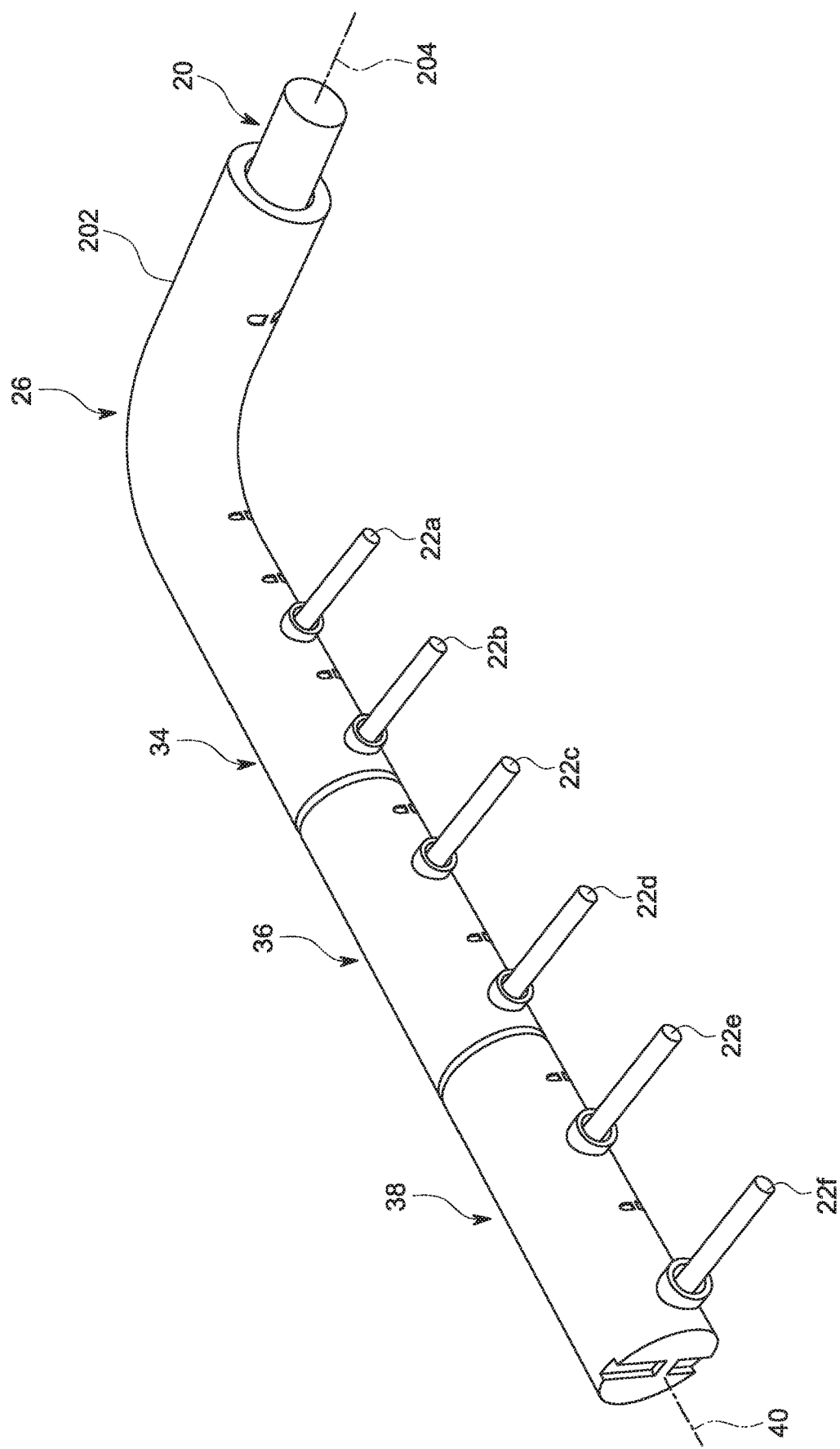
FIG. 23 depicts a perspective view of yet an even further embodiment of the spine and with the cable harness attached thereto.

As shown in FIG. 23 the entry segment 34 further includes an elbow portion 202 which having an axis 204 that is at an angle relative to the axis 40. As shown, the axis 204 is at 90 degrees relative to the axis 40, however, other angles may be provided. The elbow portion 202 may have openings 86 therethrough. The segment 200 may also be provided with the elbow portion 202.

To place the cable harness 20 into the embodiments of the spine 26 shown in FIGS. 4-11, the common member 24 is stripped away to expose the individual cables 22a-22f therein. In one example of a possible method for attaching the cable harness 20 to the spine 26, the segments 34, 36, 38 are in an open position such that the locks 46 are not engaged with the housing parts 42, 44 and the cavities 64, 84 are exposed. The cables 22a-22f are laid into the cavity 64 of the first housing part 42 and cables 22a, 22b are positioned within the first sections 90. The front ends 50, 70 of the middle section 36 are then coupled to the rear ends 52, 72 of the entry section 34 using the coupling 48. The cables 22c-22f are laid into the cavity 64 of the first housing part 42 of the middle section 36 and cables 22c, 22d are positioned within the first sections 90 of the middle section 36. The front ends 50, 70 of the end segment 38 are then coupled to the rear ends 52, 72 of the middle section 36 using the coupling 48. The cables 22e-22f are laid into the cavity 64 of the first housing part 42 of the end segment 38 and cables 22e, 22f are positioned within the first sections 90 of the end segment 38. Thereafter, the second housing parts 44 are moved to be positioned over and to engage with the first housing parts 42 and to move the housing parts 42, 44 into a closed position. The locks 46 are then engaged to complete the formation of the spine 26. Alternatively, all of the segments 34, 36, 38 can be coupled together using the coupling 48 prior to attachment of the cable harness 20 thereto. Other further methods of attaching the cable harness 20 to the spine 26, using the embodiments of the spine 26 shown in FIGS. 4-11 can be provided. The segments 34, 36, 38 form a continuous outer perimeter in a direction normal to the axis 40 when the housing parts 42, 44 are moved to the closed position.

To place the cable harness 20 into the embodiments of the spine 26 shown in FIGS. 12-19, the common member 24 is stripped away to expose the individual cables 22a-22f therein. In one example of a possible method for attaching the cable harness 20 to the spine 26, the locks 46 are not engaged with the collars 162 and the segments 34, 36, 38 are in an open position and the cavities 64, 84 are exposed. The cables 22a-22f are laid into the cavity 64 of the first housing part 42 and cables 22a, 22b are positioned within the first sections 90. The collar parts 164, 166 are coupled to the rear ends 52, 72 of the entry section 34, and the front ends 50, 70 of the middle section 36 are then placed into the collar parts 164, 166 to couple the rear ends 52, 72 of the entry section 34 and the front ends 50, 70 of the middle section 36 together. The cables 22c-22f are laid into the cavity 64 of the first housing part 42 of the middle section 36 and cables 22c, 22d are positioned within the first sections 90 of the middle section 36. The collar parts 164, 166 are coupled to the rear ends 52, 72 of the middle section 36, and the front ends 50, 70 of the end segment 38 are then placed into the collar parts 164, 166 to couple the rear ends 52, 72 of the middle section 36 and the front ends 50, 70 of the end segment 38 together. The cables 22e-22f are laid into the cavity 64 of the first housing part 42 of the end segment 38 and cables 22e, 22f are positioned within the first sections 90 of the end segment 38. Thereafter, the second housing parts 44 are moved to be positioned over and to engage with the first housing parts 42 into a closed position, and the second collar parts 166 are moved to be positioned over and to engage with the first collar parts 164 into a closed position. The locks 46 are then engaged. If the additional bosses 130, 132 and/or recesses and latch fingers 140, 142 are provided, these are also engaged. In one embodiment, after the cables 20a-20f are laid in the first housing part 42 of the entry segment 34, the housing parts 42, 44 of the entry segment 34 are closed and the additional bosses 130, 132 and/or recesses and latch fingers 140, 142 are used to maintain the entry segment 34 in the closed position prior to attachment of the collar parts 164, 166 to the entry segment 34. This can be repeated for any middle segments 36 provided in the spine 26. Other further methods of attaching the cable harness 20 to the spine 26, using the embodiments of the spine 26 shown in FIGS. 12-19 can be provided. The segments 34, 36, 38 form a continuous outer perimeter in a direction normal to the axis 40 when the housing parts 42, 44 are moved to the closed position.

While collars 162 are shown and described herein, the collars 162 can be replaced with cable ties to form the locks 46.

The cable harness 20 may have an EMI shield and strain relief 206 which seats within the front end of the cavities 64, 84 of the entry segment 34 and surrounds the cables 22a-22l as they pass therethrough. Each of the openings 86, 198 may also have an EMI shield and strain relief 206 which seats within the openings 86, 198 34 and surrounds the cables 22a-22l as they pass therethrough. The EMI shield and strain relief 206 may be formed by a rubber gasket or grommet. The EMI shield and strain relief 206 further assists in deterring the entrance of contaminants into the spine 26.

Prior art solutions for routing cables, such as cables 22-22l include braid, expando, heat shrink, tape and the like. This makes routing of the cables very labor intensive, difficult to manufacture, and the result is not very aesthetically pleasing to customers. While prior art solutions work well for automotive harnesses, such prior art solutions are not optimal for open server systems that require a high density of signal paths and uniform cable management for optimal airflow. The spine 26 of the present disclosure provides an aesthetically pleasing method of organizing and protecting the cables 22a-22l. In addition, the spine 26 is more manufacturable than prior art solutions because the spine 26 is easily installed after connector termination.

Additionally, the spine 26 may also include features (not shown), such as loops for tethering and clips that will secure the spine 26 to the rack 28.

It will be understood that there are numerous modifications of the illustrated embodiments described above which will be readily apparent to one skilled in the art, such as many variations and modifications of the spine 26 and/or its components including combinations of features disclosed herein that are individually disclosed or claimed herein, explicitly including additional combinations of such features, or alternatively other types of contact array connectors. Also, there are many possible variations in the materials and configurations.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A spine configured to support and protect a cable harness comprising:
    a front segment and a rear segment arranged along an axis, each segment including
        a first rigid, insulative housing part having a front end and an opposite rear end, a base wall extending from the front end to the rear end, and a pair of side walls extending from the base wall and extending from the front end to the rear end to form a cavity, each side wall having an end surface,
        a second rigid, insulative housing part having a front end and an opposite rear end, a base wall extending from the front end of the second housing part to the rear end of the second housing part, and a pair of side walls extending from the base wall of the second housing part and extending from the front end of the second housing part to the rear end of the second housing part to form a cavity, each side wall having an end surface,
    the housing parts being configured to be mated together along the end surfaces to form the front segment and the rear segment such that the cavities align and form a central passageway configured to receive a cable harness therein through the front segment and the rear segment, the central passageway having an axis defined from a front end of the front segment and the rear segment to a rear end of the front segment and the rear segment, and
    at least one of the housing parts having at least one opening configured to accept a cable of the cable harness therein, the opening being in communication with the central passageway, the opening having an axis which is angled relative to the axis of the central passageway;
    a lock configured to be engaged to lock the housing parts together when the housing parts are mated together, wherein the housing parts can be at least partially separated from each to expose the cavities when the lock is disengaged; and
    a coupling configured to mate the rear end of the front segment to the front end of the rear segment, wherein the rear segment has a closed rear end.

2. The spine of claim 1, wherein the axis of the opening is 90 degrees relative to the axis of the central passageway.

3. The spine of claim 1, wherein the at least one opening has a wall extending outwardly therefrom.

4. The spine of claim 1, wherein three or more segments are provided.

5. The spine of claim 4, wherein the three or more segments are arranged in an entry segment, at least one middle segment and a rear segment and the middle segment has a first end configured to engage the entry segment and second end configured to engage the rear segment, wherein the first and second end are different.

6. The spine of claim 1, wherein each end surface and a surface of each housing part forming the cavity have a metallic surface formed thereon.

7. The spine of claim 1, wherein the at least one opening has a rib provided therein, wherein when the housing parts are mated together, the rib engages with a cable in the opening.

8. The spine of claim 1, wherein each segment further comprising a hinge between the housing parts.

9. A spine configured to support and protect a cable harness comprising:
    a front segment and a rear segment arranged along an axis, each segment including
        a first rigid, insulative housing part having a front end and an opposite rear end, a base wall extending from the front end to the rear end, and a pair of side walls extending from the base wall and extending from the front end to the rear end to form a cavity, each side wall having an end surface,
        a second rigid, insulative housing part having a front end and an opposite rear end, a base wall extending from the front end of the second housing part to the rear end of the second housing part, and a pair of side walls extending from the base wall of the second housing part and extending from the front end of the second housing part to the rear end of the second housing part to form a cavity, each side wall having an end surface, the housing parts being configured to be mated together along the end surfaces to form the front segment and the rear segment such that the cavities align and form a central passageway configured to receive a cable harness therein through the front segment and the rear segment, the central passageway having an axis defined from a front end of the front segment and the rear segment to a rear end of the front segment and the rear segment, and at least one of the housing parts having at least one opening configured to accept a cable of the cable harness therein, the opening being in communication with the central passageway, the opening having an axis which is angled relative to the axis of the central passageway;

a lock configured to be engaged to lock the housing parts together when the housing parts are mated together, wherein the housing parts can be at least partially separated from each to expose the cavities when the lock is disengaged; and a coupling configured to mate the rear end of the front segment to the front end of the rear segment, wherein the coupling comprises a collar attached to adjacent ends of the segments, the collar comprises a first collar part coupled to the first housing parts, and a second collar part coupled to the second housing parts, the collar parts being mated together.

10. The spine of claim 9, wherein the collar parts are separable from each of the housing parts.

11. The spine of claim 9, wherein each segment further includes a hinge between the housing parts.

12. The spine of claim 9, wherein the lock comprises one of at least one fastener mating the first and second collar parts together and at least one depressible latch on one of the collar parts which engages with a recess on the other collar part.

13. The spine of claim 12, further comprising one of at least one fastener coupling the housing parts together and at least one depressible latch on one of the housing parts which engages with a recess on the other housing part.

14. The spine of claim 9, wherein the coupling further comprises one of the segments having a front flange portion extending from a front end of each of the housing parts, and the other of the segments having a rear flange portion extending from a rear end of each of the housing parts, the flange portions being seated within the collar when the housing parts are mated together and the collar is attached to the housing parts.

15. A spine configured to support and protect a cable harness comprising:

a front segment and a rear segment arranged along an axis, each segment including a first rigid, insulative housing part having a front end and an opposite rear end, a base wall extending from the front end to the rear end, and a pair of side walls extending from the base wall and extending from the front end to the rear end to form a cavity, each side wall having an end surface, a second rigid, insulative housing part having a front end and an opposite rear end, a base wall extending from the front end of the second housing part to the rear end of the second housing part, and a pair of side walls extending from the base wall of the second housing part and extending from the front end of the second housing part to the rear end of the second housing part to form a cavity, each side wall having an end surface, the housing parts being configured to be mated together along the end surfaces to form the front segment and the rear segment such that the cavities align and form a central passageway configured to receive a cable harness therein through the front segment and the rear segment, the central passageway having an axis defined from a front end of the front segment and the rear segment to a rear end of the front segment and the rear segment, and at least one of the housing parts having at least one opening configured to accept a cable of the cable harness therein, the opening being in communication with the central passageway, the opening having an axis which is angled relative to the axis of the central passageway;

a lock configured to be engaged to lock the housing parts together when the housing parts are mated together, wherein the housing parts can be at least partially separated from each to expose the cavities when the lock is disengaged; and a coupling configured to mate the rear end of the front segment to the front end of the rear segment, wherein the coupling comprises one of the segments having a front flange portion extending from a front end of each of the housing parts, and the other of the segments having a rear flange portion extending from a rear end of each of the housing parts, the flange portions being engaged with each other.

16. The spine of claim 15, wherein the lock comprises one of at least one fastener mating the first and second housing parts together in each segment and at least one depressible latch on one of the collar parts which engages with a recess on the other collar part in each segment.

17. A spine configured to support and protect a cable harness comprising:

a front segment and a rear segment arranged along an axis, each segment including a first rigid, insulative housing part having a front end and an opposite rear end, a base wall extending from the front end to the rear end, and a pair of side walls extending from the base wall and extending from the front end to the rear end to form a cavity, each side wall having an end surface, a second rigid, insulative housing part having a front end and an opposite rear end, a base wall extending from the front end of the second housing part to the rear end of the second housing part, and a pair of side walls extending from the base wall of the second housing part and extending from the front end of the second housing part to the rear end of the second housing part to form a cavity, each side wall having an end surface, the housing parts being configured to be mated together along the end surfaces to form the front segment and the rear segment such that the cavities align and form a central passageway configured to receive a cable harness therein through the front segment and the rear segment, the central passageway having an axis defined from a front end of the front segment and the rear segment to a rear end of the front segment and the rear segment, and at least one of the housing parts having at least one opening configured to accept a cable of the cable harness therein, the opening being in communication with the central passageway, the opening having an axis which is angled relative to the axis of the central passageway;

a lock configured to be engaged to lock the housing parts together when the housing parts are mated together, wherein the housing parts can be at least partially separated from each to expose the cavities when the lock is disengaged; and a coupling configured to mate the rear end of the front segment to the front end of the rear segment, wherein the coupling comprises a collar attached to adjacent ends of the segments, the collar comprises a first collar part coupled to the first housing parts, and a second collar part coupled to the second housing parts, the collar parts being mated together.

18. The spine of claim 17, wherein the lock comprises one of at least one fastener mating the first and second collar parts together and at least one depressible latch on one of the collar parts which engages with a recess on the other collar part.

19. The spine of claim 18, further comprising one of at least one fastener coupling the housing parts together and at least one depressible latch on one of the housing parts which engages with a recess on the other housing part.

20. The spine of claim 17, wherein the coupling further comprises one of the segments having a front flange portion extending from a front end of each of the housing parts, and the other of the segments having a rear flange portion extending from a rear end of each of the housing parts, the flange portions being seated within the collar when the housing parts are mated together and the collar is attached to the housing parts.

\* \* \* \* \*